(12) United States Patent
Sakai

(10) Patent No.: US 8,882,246 B2
(45) Date of Patent: Nov. 11, 2014

(54) LIQUID EJECTING HEAD, LIQUID EJECTING APPARATUS, PIEZOELECTRIC ELEMENT, AND METHOD OF MANUFACTURING PIEZOELECTRIC ELEMENT

(71) Applicant: Seiko Epson Corporation, Tokyo (JP)

(72) Inventor: Tomohiro Sakai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/850,652

(22) Filed: Mar. 26, 2013

(65) Prior Publication Data

US 2013/0250011 A1      Sep. 26, 2013

(51) Int. Cl.
| | |
|---|---|
| *B41J 2/045* | (2006.01) |
| *B41J 2/16* | (2006.01) |
| *H01L 41/08* | (2006.01) |
| *H01L 41/319* | (2013.01) |
| *H01L 41/187* | (2006.01) |
| *B41J 2/14* | (2006.01) |
| *H01L 41/318* | (2013.01) |

(52) U.S. Cl.
CPC ............ *B41J 2/14233* (2013.01); *B41J 2/1628* (2013.01); *B41J 2/1642* (2013.01); *B41J 2002/14241* (2013.01); *H01L 41/0815* (2013.01); *B41J 2/1623* (2013.01); *B41J 2/1632* (2013.01); *B41J 2/1645* (2013.01); *H01L 41/318* (2013.01); *B41J 2/1646* (2013.01); *B41J 2/164* (2013.01); *H01L 41/319* (2013.01); *B41J 2/161* (2013.01); *B41J 2/1629* (2013.01); *B41J 2002/14419* (2013.01); *H01L 41/1878* (2013.01)

USPC ............................................................ 347/68

(58) Field of Classification Search
None
See application file for complete search history.

(56) References Cited

U.S. PATENT DOCUMENTS

| | | | |
|---|---|---|---|
| 7,736,761 B2 * | 6/2010 | Foltyn et al. ................... | 428/701 |
| 2007/0241642 A1 | 10/2007 | Miyazawa et al. | |
| 2009/0230211 A1 | 9/2009 | Kobayashi et al. | |
| 2011/0216130 A1 * | 9/2011 | Hamada .......................... | 347/68 |

FOREIGN PATENT DOCUMENTS

| | | |
|---|---|---|
| JP | 2001-223404 | 8/2001 |
| JP | 2007-287745 | 11/2007 |
| JP | 2009-242229 | 10/2009 |
| JP | 2009-252789 | 10/2009 |

* cited by examiner

*Primary Examiner* — Matthew Luu
*Assistant Examiner* — Erica Lin
(74) *Attorney, Agent, or Firm* — Workman Nydegger

(57) ABSTRACT

To provide a liquid ejecting head having a piezoelectric layer in which crack occurrence is suppressed and the crystal is oriented in a specific orientation, a piezoelectric element a liquid ejecting apparatus and a method of manufacturing a piezoelectric element. A liquid ejecting head which discharges liquid from a nozzle opening, includes a piezoelectric element having a piezoelectric layer and a first electrode and a second electrode provided on the piezoelectric layer. The piezoelectric layer has a buffer layer made of bismuth manganate or a mixed crystal of bismuth manganate and bismuth ferrite, provided on the first electrode, and a piezoelectric material layer having a perovskite structure, provided on the buffer layer.

7 Claims, 18 Drawing Sheets

FIG. 11
(a) EXAMPLE 1
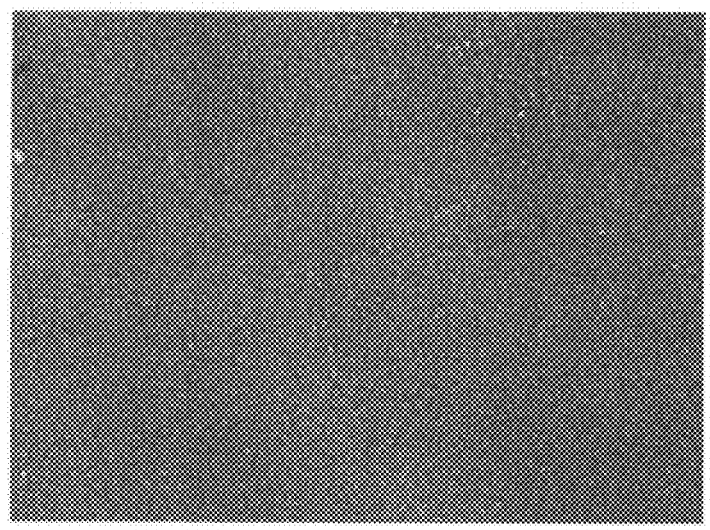
(b) EXAMPLE 2
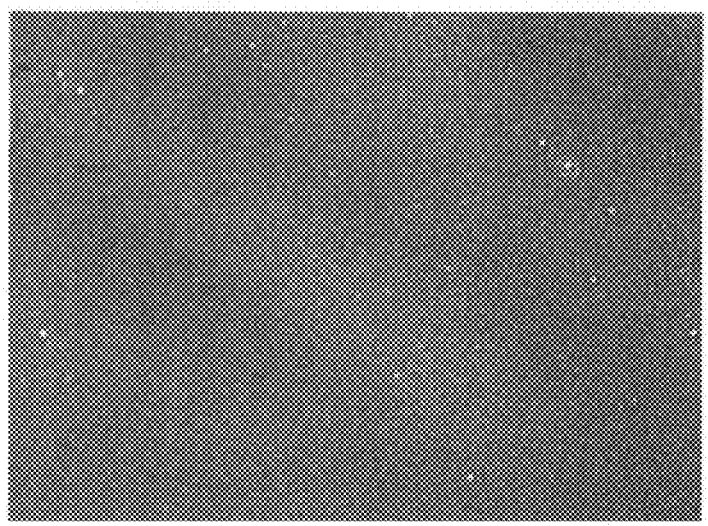

FIG. 12
(a) EXAMPLE 3
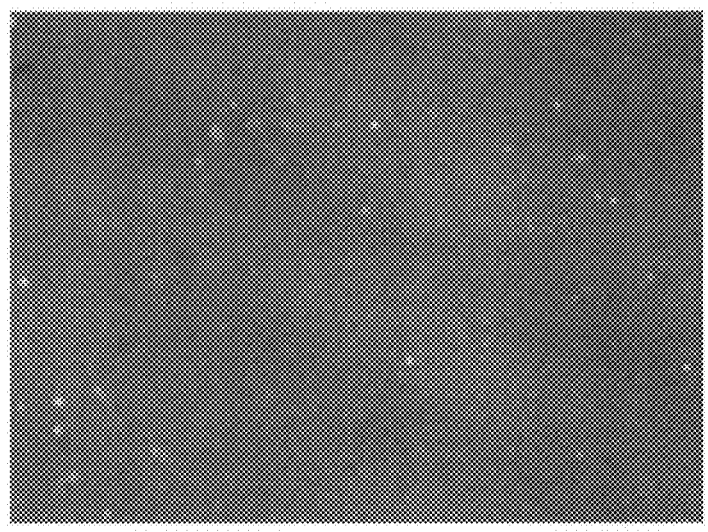
(b) EXAMPLE 4
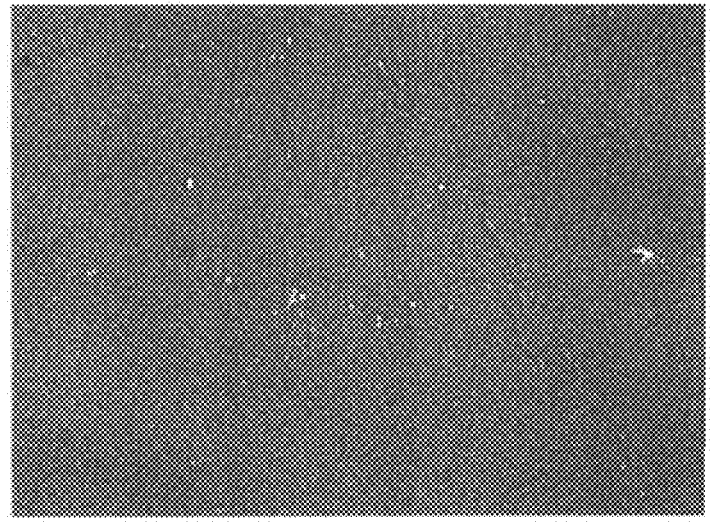

EXAMPLE 7

FIG. 15
(a) COMPARATIVE EXAMPLE 1
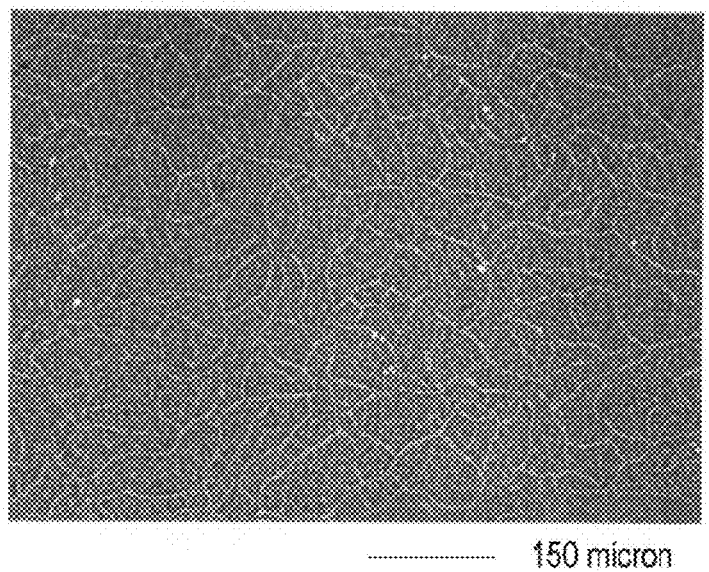
150 micron
(b) COMPARATIVE EXAMPLE 2
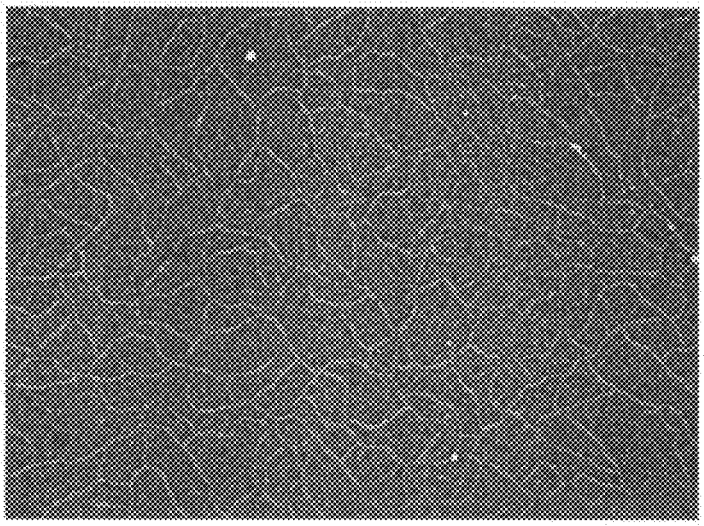
150 micron

FIG. 18
EXAMPLE 8
Pt
(111)    (100)
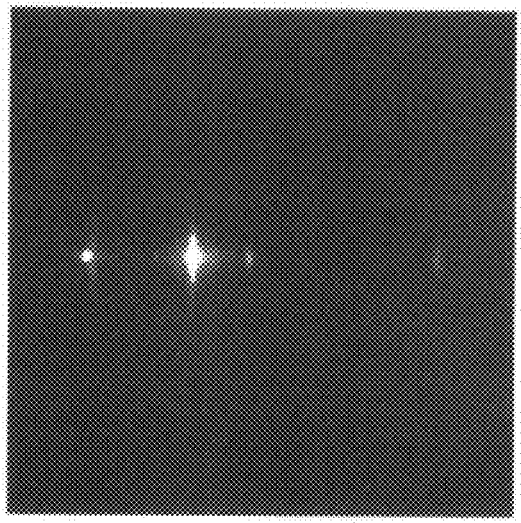
COMPARATIVE EXAMPLE 3
Pt
(111)    (110)
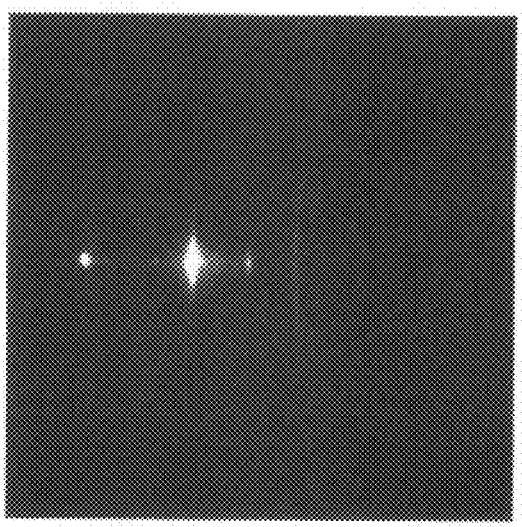
FIG. 19
EXAMPLE 9
Pt
(111)   (110)   (100)
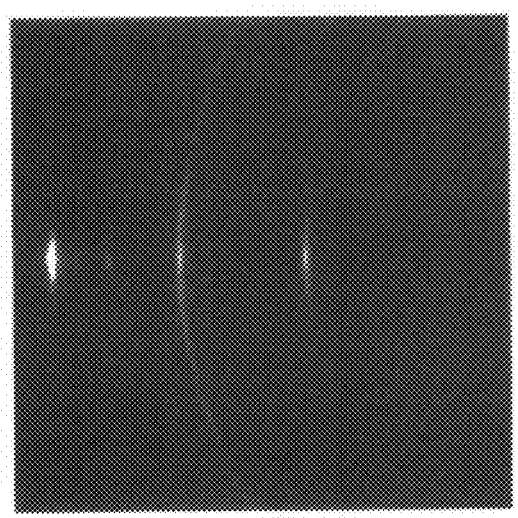
COMPARATIVE EXAMPLE 4
Pt
(111)    (110)
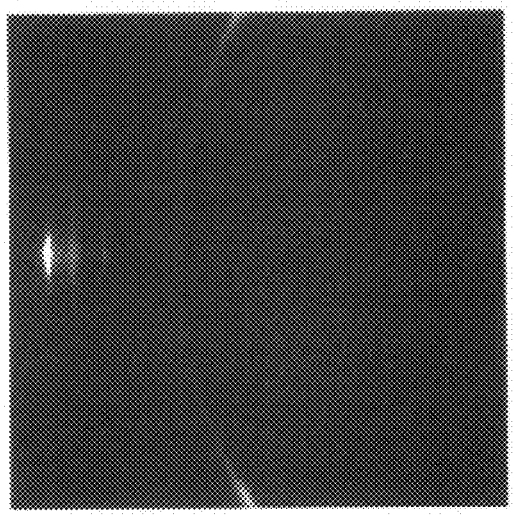

LIQUID EJECTING HEAD, LIQUID EJECTING APPARATUS, PIEZOELECTRIC ELEMENT, AND METHOD OF MANUFACTURING PIEZOELECTRIC ELEMENT

TECHNICAL FIELD

The present invention relates to a liquid ejecting head including a piezoelectric element which has a piezoelectric layer made of a piezoelectric material and an electrode and discharging liquid droplets from a nozzle opening, a liquid ejecting apparatus, a piezoelectric element, and a method of manufacturing a piezoelectric element.

BACKGROUND ART

As a typical example of a liquid ejecting head, for example, there is an ink jet type recording head in which a part of a pressure generating chamber which communicates with a nozzle to discharge liquid droplets is formed of a vibration plate and the vibration plate is deformed by a piezoelectric element to pressurize ink in the pressure generating chamber so that the ink droplets are discharged from the nozzle. As a piezoelectric element used in the ink jet type recording head, there is a piezoelectric element in which a piezoelectric layer (piezoelectric film) made of a piezoelectric material having an electromechanical transduction function, for example, a crystallized dielectric material is interposed between two electrodes.

Since high piezoelectric properties are demanded for the piezoelectric material used as the piezoelectric layer forming the piezoelectric element, a typical example of the piezoelectric material may be lead zirconate titanate (PZT) (for example, refer to PTL 1).

As a piezoelectric material not containing lead, for example, there is a $BiFeO_3$-based piezoelectric material containing Bi and Fe (for example, refer to PTL 2).

CITATION LIST

Patent Literature

[PTL 1] JP-A-2001-223404
[PTL 2] JP-A-2007-287745

SUMMARY OF INVENTION

Technical Problem

However, the piezoelectric layer made of the PZT-based or $BiFeO_3$-based piezoelectric material has problems that cracks easily occur during manufacturing and after a predetermined time elapsed from manufacturing and desired piezoelectric properties cannot be obtained. It is preferable that a crystal of the piezoelectric layer be oriented in a specific orientation to sufficiently exhibit piezoelectric properties.

In addition, such problems exist not only in an ink jet type recording head, but also in other liquid ejecting heads which discharge liquid droplets other than ink. Moreover, such problems also exist in a piezoelectric element used for apparatuses other than a liquid ejecting head.

The invention is made in consideration of the circumstances and an object thereof is to provide a liquid ejecting head having a piezoelectric layer in which crack occurrence is suppressed and the crystal is oriented in a specific orientation, a liquid ejecting apparatus, a piezoelectric element, and a method of manufacturing a piezoelectric element.

Solution to Problem

According to an aspect of the invention, there is provided a liquid ejecting head which discharges liquid from a nozzle opening including a piezoelectric element having a piezoelectric layer and a first electrode and a second electrode provided on the piezoelectric layer in which the piezoelectric layer has a buffer layer made of bismuth manganate or a mixed crystal of bismuth manganate and bismuth ferrite, provided on the first electrode, and a piezoelectric material layer having a perovskite structure, provided on the buffer layer.

In the aspect, since the piezoelectric layer has a laminated structure of the buffer layer made of bismuth manganate or a mixed crystal of bismuth manganate and bismuth ferrite and the piezoelectric material layer, the liquid ejecting head having the piezoelectric layer in which crack occurrence is suppressed and the crystal is strongly oriented in a specific orientation, particularly, to a (100) plane, may be formed.

Here, it is preferable for the piezoelectric material layer to contain bismuth, iron, barium and titanium, bismuth, sodium and titanium, or lead, titanium and zirconium.

In the aspect, crack occurrence is suppressed and the crystal of the piezoelectric material layer is further strongly oriented in a specific orientation.

Here, it is preferable for the piezoelectric material layer to contain bismuth, iron, barium and titanium and further contain manganese. Accordingly, leakage properties of the piezoelectric layer can be improved.

Here, the piezoelectric material layer is preferentially oriented to a (100) plane in the liquid ejecting head according any of the above descriptions.

In the aspect, the liquid ejecting head having the piezoelectric layer in which crack occurrence is suppressed and the crystal is strongly oriented to the (100) plane may be formed.

According to another aspect of the invention, there is provided a liquid ejecting apparatus including the liquid ejecting head according to any one of the above descriptions.

In the aspect, the liquid ejecting apparatus including the liquid ejecting head having the piezoelectric layer in which crack occurrence is suppressed and the crystal is strongly oriented in a specific orientation may be formed.

According to still another aspect of the invention, there is provided a piezoelectric element including a piezoelectric layer; and a first electrode and a second electrode provided on the piezoelectric layer, in which the piezoelectric layer has a buffer layer made of bismuth manganate or a mixed crystal of bismuth manganate and bismuth ferrite, provided on the first electrode, and a piezoelectric material layer having a perovskite structure, provided on the buffer layer.

In the aspect, the piezoelectric element having the piezoelectric layer in which crack occurrence is suppressed and the crystal is strongly oriented in a specific orientation may be formed.

According to still another aspect of the invention, there is provided a method of manufacturing a piezoelectric element having a piezoelectric layer and a first electrode and a second electrode provided on the piezoelectric layer, the method including forming a buffer layer made of bismuth manganate or a mixed crystal of bismuth manganate and bismuth ferrite on the first electrode; and forming a piezoelectric material layer having a perovskite structure on the buffer layer.

In the aspect, since the piezoelectric layer is formed by providing the piezoelectric material layer having a perovskite structure on the buffer layer made of bismuth manganate or a mixed crystal of bismuth manganate and bismuth ferrite, the piezoelectric element having the piezoelectric layer in which crack occurrence is suppressed and the crystal is strongly oriented in a specific orientation may be manufactured.

BRIEF DESCRIPTION OF DRAWINGS

FIG. 11 is a metallurgical photomicrograph in which the surface of a piezoelectric layer in Examples 1 and 2 is observed.

FIG. 12 is a metallurgical photomicrograph in which the surface of a piezoelectric layer in Examples 3 and 4 is observed.

FIG. 15 is a metallurgical photomicrograph in which the surface of a piezoelectric layer in Comparative Examples 1 and 2 is observed.

FIG. 18 is a two-dimensional mapping showing X-ray diffraction intensity of the piezoelectric layer in Example 8 and Comparative Example 3.

FIG. 19 is a two-dimensional mapping showing X-ray diffraction intensity of the piezoelectric layer in Example 9 and Comparative Example 4.

DESCRIPTION OF EMBODIMENTS

Example 1

Figure 1:
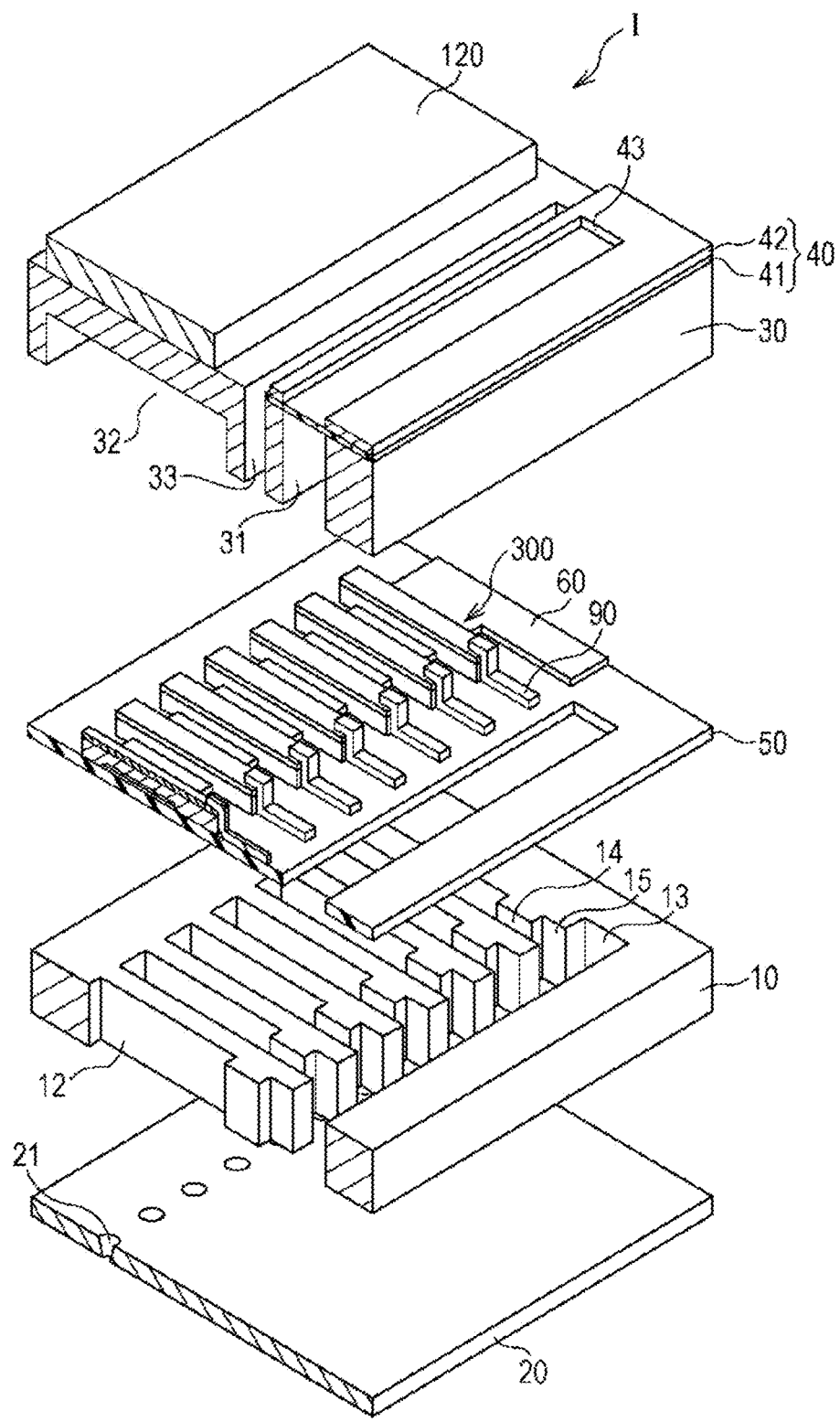
FIG. 1 is an exploded perspective view showing a schematic configuration of a recording head according to Embodiment 1.
Figure 2:
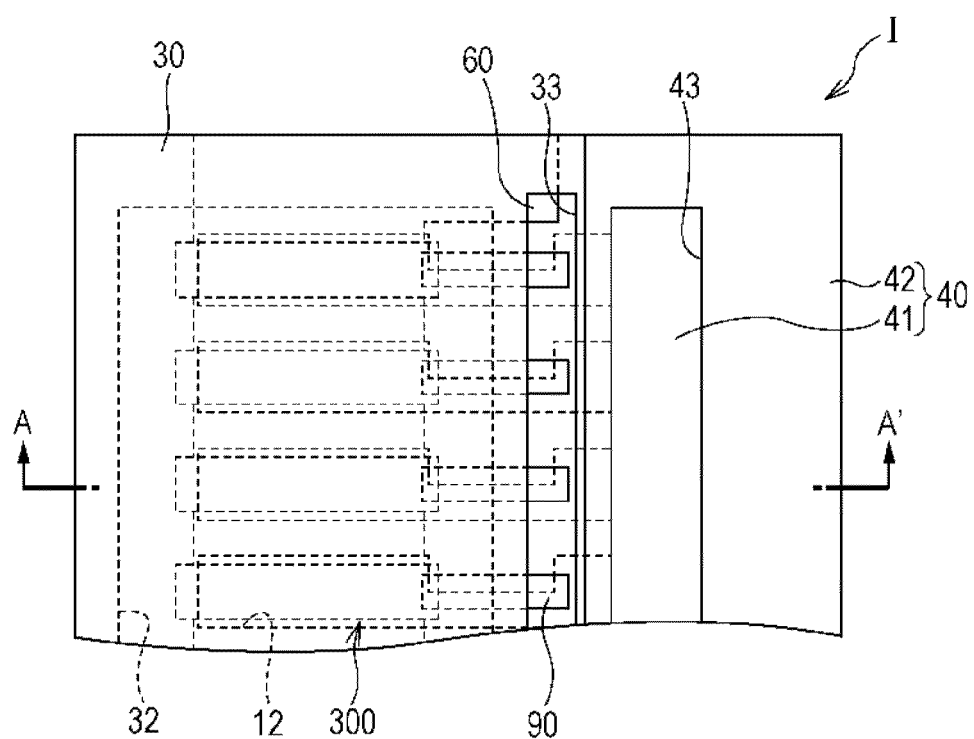
FIG. 2 is a plan view of the recording head according to Embodiment 1.
Figure 3:
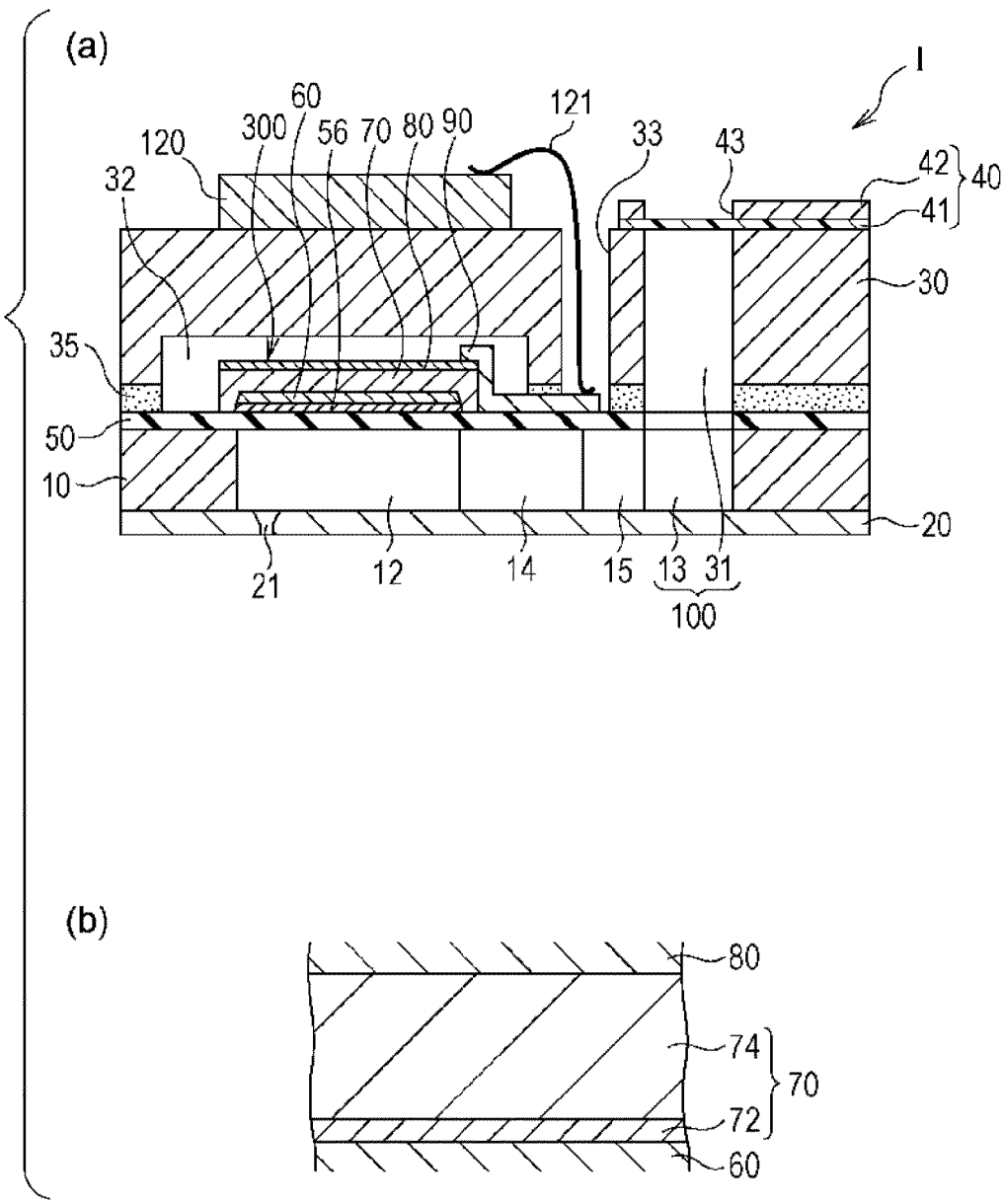
FIG. 3 is a cross-sectional view and an enlarged cross-sectional view of a main part of the recording head according to Embodiment 1.
Figure 4:
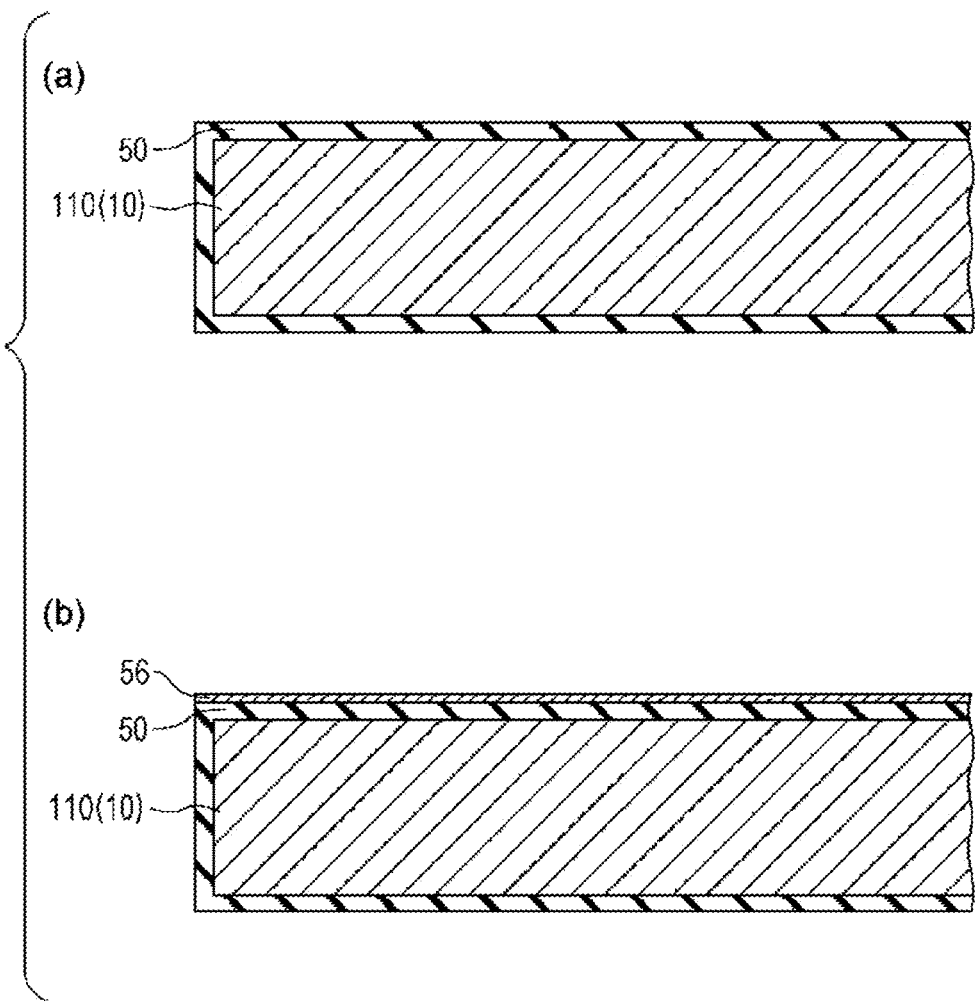
FIG. 4 is a cross-sectional view showing a process of manufacturing the recording head according to Embodiment 1.

FIG. 1 is an exploded perspective view showing a schematic configuration of a recording head as an example of a liquid ejecting head manufactured by a manufacturing method according to Embodiment 1 of the invention, FIG. 2 is a plan view of FIG. 1, FIG. 3 (a) is a cross-sectional view of the recording head taken along the line A-A' of FIG. 2, and FIG. 3(b) is an enlarged cross-sectional view of a main part of the recording head of FIG. 3(a). As shown in FIGS. 1 to 3, a flow passage forming substrate 10 according to the embodiment is made of a silicon single crystal substrate and an elastic film 50 made of silicon dioxide is formed on one surface of the flow passage forming substrate.

On the flow passage forming substrate 10, plural pressure generating chambers 12 are provided in parallel in the width direction thereof. In addition, a communication portion 13 is formed in a region outside of the pressure generating chambers 12 of the flow passage forming substrate 10 in a longitudinal direction and the communication portion 13 communicates with the respective pressure generating chambers 12 through ink supply paths 14 and communication paths 15 each of which is provided in every pressure generating chamber 12. The communication portion 13 communicates with a manifold portion 31 of a protective substrate which will be described later and forms a part of a manifold which is a common ink chamber of the respective pressure generating chambers 12. The ink supply path 14 is formed to have a smaller width than that of the pressure generating chamber 12, and maintains a constant resistance in the flow passage against ink flowing from the communication portion 13 to the pressure generating chamber 12. While the width of each flow passage is narrowed on one side surface in the embodiment to form the ink supply path 14, the width of each flow passage may be narrowed at both sides thereof to form the ink supply path. Moreover, instead of narrowing the width of the flow passages, the ink supply paths may be formed by narrowing the flow passages from the thickness direction. In the embodiment, the flow passage forming substrate 10 is provided with liquid flow passages, which are configured with the pressure generating chambers 12, the communication portion 13, the ink supply path 14, and the communication path 15.

A nozzle plate 20 in which each of nozzle openings 21 is punctured in communication with vicinity of an end portion of each pressure generating chamber 12 opposite to the ink supply path 14 is fixed to an opening surface of the flow passage forming substrate 10 with an adhesive, a thermal bonding film, or the like. For example, the nozzle plate 20 may be made of glass ceramic, a silicon single crystal substrate, or stainless steel.

On the other hand, the elastic film 50 is formed on the opposite side of the opening surface of the flow passage forming substrate 10, as described above. On the elastic film 50, an adhesion layer 56 made of a titanium oxide having a thickness of, for example, approximately 30 to 50 nm is provided in order to improve the adhesiveness of the elastic film 50 and the like with the foundation of a first electrode 60. Meanwhile, an insulating film made of zirconium oxide may be provided on the elastic film 50 as necessary.

Furthermore, the first electrode 60 made of platinum (Pt), a buffer layer 72 made of an oxide containing manganese and bismuth or an oxide containing manganese, bismuth and iron which will be described later in detail, a piezoelectric layer 70 made of a piezoelectric material layer 74 having a perovskite structure and a second electrode 80 are laminated on the adhesion layer 56 so as to configure each piezoelectric element 300 as pressure generating means that causes the pressure generating chambers 12 to generate changes in the pressure. Here, the piezoelectric element 300 refers to a part which includes the first electrode 60, the piezoelectric layer 70 and the second electrode 80. In general, any one of the electrodes in the piezoelectric element 300 forms a common electrode, and the other electrode and the piezoelectric layer 70 are patterned for each of the pressure generating chambers 12. In the embodiment, while the first electrode 60 is used as the common electrode of the piezoelectric element 300 and the second electrode 80 is used as the individual electrode of the piezoelectric element 300, the functions of the first and second electrodes may be reversed for the sake of convenience of the driving circuit and wiring. In addition, an actuator apparatus mentioned herein is defined by a combination of the piezoelectric element 300 and a vibration plate that is displaced by the driving of the piezoelectric element 300. Although in the above example, the elastic film 50, the adhesion layer 56, the first electrode 60, and the insulating film optionally provided function as a vibration plate, the structure of the vibration plate is not limited to the above structure and, for example, the elastic film 50 or the adhesion layer 56 may not be provided. Moreover, the piezoelectric element 300 itself may function as a vibration plate in substance.

In the embodiment, the buffer layer 72 is made of an oxide containing manganese and bismuth or an oxide containing manganese, bismuth and iron. A molar composition ratio of bismuth, manganese and iron is bismuth:manganese:iron=100:100:0 to 100:2:98.

Moreover, when the plural piezoelectric material layers 74 are baked, there is a possibility of component element dispersion between the buffer layer 72 and the piezoelectric material layers 74, and the buffer layer 72 may not be detected as a completely separated layer. However, it can be confirmed that for example, there is a region having a high Mn concentration on the side of the first electrode of the piezoelectric layer 70 and thus, the buffer layer 72 is present.

The buffer layer 72 in the embodiment functions as an orientation control layer that makes the piezoelectric material layer 74 having a perovskite structure which is formed on the buffer layer 72 strongly oriented in a specific orientation, particularly, to a (100) plane. The strong orientation in a specific orientation in the embodiment includes a case where a peak of a main orientation is observed not only when the crystal is singly oriented in a certain orientation and an almost equivalent orientation thereof, but also when the crystal is oriented in plural orientations and equivalent orientations thereof. For example, when the piezoelectric material layer 74 contains bismuth, iron, barium and titanium or bismuth, sodium and titanium, the crystal of the piezoelectric layer is strongly oriented to the (100) plane. Moreover, when the piezoelectric material layer 74 contains lead, titanium and zirconium, the crystal of the piezoelectric layer 70 is strongly oriented to a (111) plane without the buffer layer 72, but the crystal is oriented to the (100) plane, a (110) plane and the (111) plane in a mixed manner and mainly oriented to the (100) plane by providing the buffer layer 72. The piezoelectric layer 70 strongly or mainly oriented to the (100) plane is a film in which crack occurrence is remarkably suppressed as in the examples which will be described later.

A piezoelectric body has various different physical properties such as a displacement, dielectric constant and Young's modulus depending on the orientation of the crystal. Therefore, when the orientation of the piezoelectric body is a single orientation or plural orientations, a case where there is a main orientation plane can exhibits properties of the piezoelectric body better in comparison with a case where the main orientation plane is not observed when a random orientation or plural orientations are observed. As a result, the piezoelectric body strongly oriented in a specific orientation is excellent in piezoelectric properties.

The piezoelectric material layer 74 provided on the buffer layer 72 is a piezoelectric material layer made of an oxide having a perovskite structure containing bismuth, iron, barium and titanium, bismuth, sodium and titanium, or lead, titanium and zirconium. Specific examples thereof include mixed crystals of bismuth ferrite-based oxides and bismuth titanate-based oxides and oxides having a perovskite structure which is made of bismuth titanate-based oxides or lead titanate-based oxides.

The perovskite structure, that is, an A site in an $ABO_3$ type structure has 12-fold oxygen coordination, and a B site has 6-fold oxygen coordination, thereby forming an octahedron. Bi, Ba, Na and Pb are located in the A site, and Fe, Ti and Zr are located in the B site.

Examples of the bismuth ferrite-based oxide include bismuth ferrite ($BiFeO_3$), bismuth ferrite aluminate ($Bi(Fe,Al)O_3$), bismuth ferrite manganate ($Bi(Fe,Mn)O_3$), bismuth lanthanum ferrite manganate ($(Bi,La)(Fe,Mn)O_3$), bismuth barium ferrite manganate titanate ($(Bi,Ba)(Fe,Mn,Ti)O_3$), bismuth ferrite cobaltate ($Bi(Fe, Co)O_3$), bismuth cerium ferrite ($(Bi,Ce)FeO_3$), bismuth cerium ferrite manganate ($(Bi,Ce)(Fe,Mn)O_3$), bismuth lanthanum cerium ferrite ($(Bi,La,Ce)FeO_3$), bismuth lanthanum cerium ferrite manganate ($(Bi,La,Ce)(Fe,Mn)O_3$), bismuth samarium ferrite ($(Bi,Sm)FeO_3$), bismuth ferrite chromate ($Bi(Cr,Fe)O_3$), bismuth potassium ferrite manganate titanate ($(Bi,K)(Fe,Mn,Ti)O_3$), and bismuth barium ferrite manganate zincate titanate ($(Bi,Ba)(Fe,Mn,Zn,Ti)O_3$).

In addition, examples of the bismuth titanate-based oxide include bismuth sodium titanate ($(Bi,Na)TiO_3$), bismuth sodium potassium titanate ($(Bi,Na,K)TiO_3$), bismuth barium sodium titanate zincate ($(Bi,Na,Ba)(Zn,Ti)O_3$), or bismuth barium sodium titanate cuprate ($(Bi,Na,Ba)(Cu,Ti)O_3$). In addition, examples of the bismuth titanate-based oxide include bismuth potassium titanate ($(Bi,K)TiO_3$) and bismuth chromate ($BiCrO_3$). In addition, for example, $Bi(Zn_{1/2}Ti_{1/2})O_{1/2}$, $(Bi_{1/2}K_{1/2})TiO_3$, and (Li, Na, K) (Ta, Nb) $O_3$ may be added to the above-described composite oxides.

When the piezoelectric material layer 74 is a composite oxide having a perovskite structure containing Bi, Fe, Ba and Ti, the composite oxide is a mixed crystal of bismuth ferrite and barium titanate, or a solid solution in which bismuth ferrite and barium titanate are uniformly solid-soluted. In the X-ray diffraction pattern, bismuth ferrite and barium titanate are not detected alone. Here, bismuth ferrite and barium titanate have been known piezoelectric materials each having a perovskite structure and materials having various composition has been known respectively. For example, other than $BiFeO_3$ and $BaTiO_3$, compositions in which some of elements (Bi, Fe, Ba, Ti and O) are deficient or excessive, or some of the elements are substituted with another element are known as bismuth ferrite and barium titanate. However, when "bismuth ferrite" and "bismuth titanate" are noted in the invention, the compositions shifted from the stoichiometric composition due to excess or deficiency of the elements and the compositions in which some of the elements are substituted with another element are also included in ranges of bismuth ferrite and barium titanate as long as there are no changes in the basic properties. In addition, a ratio of bismuth ferrite manganate and barium titanate can be variously changed.

The composition of the piezoelectric material layer 74 made of the composite oxide having a perovskite structure containing Bi, Fe, Ba and Ti can be represented as ((Bi, Ba) (Fe, Ti)O$_3$). The representative composition thereof is represented as the mixed crystal represented by the following general expression (1). Moreover, the general expression (1) can be represented as the following general expression (1'). Here, the general expression (1) and the general expression (1') are composition notations represented on the basis of the stoichiometric composition and as described above, and an inevitable shift of the compositions due to a lattice mismatch, oxygen deficiency, substitution of some elements or the like is permitted as far as a perovskite structure can be obtained. For example, when a stoichiometric composition ratio is 1, a composition in the range of 0.85 to 1.20 is permitted. In addition, in the case of being represented by the following general expressions, other compounds can be considered as the same composite oxide when the ratio of the element in the A site and the element in the B site are the same.

$(1-x)[\text{BiFeO}_3]-x[\text{BaTiO}_3]$ $(0 < x < 0.40)$     (1)

$(\text{Bi}_{1-x}\text{Ba}_x)(\text{Fe}_{1-x}\text{Ti}_x)\text{O}_3$ $(0 < x < 0.40)$     (1')

When the piezoelectric material layer 74 is the composite oxide having a perovskite structure containing Bi, Fe, Ba and Ti, elements other than Bi, Fe, Ba and Ti may be contained. Examples of other elements include Mn, Co and Cr. Naturally, even when the composite oxide contains other elements, the composite oxide is necessary to have a perovskite structure. When the piezoelectric material layer 74 contains Mn, Co and Cr, the composite oxide has a structure in which Mn, Co and Cr are located in the B site. For example, in case where the composite oxide contains Mn, it has been found that while the composite oxide forming the piezoelectric material layer 74 is represented as a composite oxide having a structure in which some of Fe in the solid solution in which bismuth ferrite and barium titanate are uniformly solid-soluted are substituted with Mn, or a composite oxide having a perovskite structure of a mixed crystal of bismuth manganate ferrite and barium titanate and the basic properties are the same as the composite oxide having the perovskite structure of the mixed crystal of bismuth ferrite and barium titanate, it is found that the leakage properties are improved. Moreover, when the piezoelectric material layer 74 contains Co or Cr, the leakage properties are improved similar to the case of Mn. In the X-ray diffraction pattern, bismuth ferrite, barium titanate, bismuth ferrite manganate, bismuth ferrite cobaltate and bismuth ferrite chromate are not detected alone. While Mn, Co and Cr are described as an example, it has been found that leakage properties are improved even in a case where 2 elements among other transition metal elements are contained at the same time. The piezoelectric material layer 74 can contain the elements and, further, may contain other known additives to improve the properties. Particularly, when the piezoelectric material layer contains Mn, leakage properties are improved and compatibility between the piezoelectric material layer and the buffer layer 72 containing bismuth manganate becomes favorable. Therefore, it is assumed that an effect of suppressing crack occurrence is improved.

The piezoelectric material layer 74 is the composite oxide having a perovskite structure containing Mn, Co and Cr, in addition to Bi, Fe, Ba and Ti is represented as ((Bi, Ba) (Fe, Ti, Mn, Co, Cr)O$_3$). The representative composition thereof is represented as the mixed crystal represented by the following general expression (2). In addition, the general formula (2) can be represented by the following formula (2'). In the general formula (2) and the general formula (2'), M is Mn, Co or Cr. Here, the general formula (2) and the general formula (2') are composition notations represented on the basis of the stoichiometric composition and, as described above, and an inevitable shift of the compositions due to a lattice mismatch, oxygen deficiency, substitution of some elements or the like is permitted as far as a perovskite structure can be obtained. For example, when a stoichiometric composition ratio is 1, a composition in the range of 0.85 to 1.20 is permitted. In addition, in the case of being represented by the following general formulae, other compounds can be considered as the same composite oxide when the ratio of the element in the A site and the element in the B site are the same.

$(1-x)[\text{Bi}(\text{Fe}_{1-y}\text{M}_y)\text{O}_3]-x[\text{BaTiO}_3]$ $(0 < x < 0.40, 0.01 < y < 0.10)$     (2)

$(\text{Bi}_{1-x}\text{Ba}_x)((\text{Fe}_{1-y}\text{M}_y)_{1-x}\text{Ti}_x)\text{O}_3$ $(0 < x < 0.40, 0.01 < y < 0.10)$     (2')

When the piezoelectric material layer 74 is the composite oxide having a perovskite structure containing Bi, Na and Ti, the composite oxide is preferably made of a material containing bismuth sodium titanate as a main component, but mixed crystals or solid solutions containing materials having other piezoelectric properties can be used. The materials having other piezoelectric properties are oxides having a perovskite structure and examples thereof include at least one selected from the lead-free compound group consisting of barium titanate, bismuth potassium titanate, sodium niobate, potassium niobate, lithium niobate, bismuth ferrite, bismuth chromate, bismuth cobaltate, and bismuth aluminate. As described above, the piezoelectric material layer 74 containing Bi, Na and Ti can contain Mn, Co and Cr. The piezoelectric material layer contains at least one or more elements so as to improve leak properties.

When the piezoelectric material layer 74 is the composite oxide having a perovskite structure containing lead, titanium and zirconium, the oxide is preferably made of a material containing lead zirconate titanate (Pb(Zr,Ti)O$_3$) as a main component, but additionally, a solid solution (Pb(Mg$_{1/3}$Nb$_{2/3}$)O$_3$—PbTiO$_3$) of lead magnesium niobate and lead titanate, a solid solution (Pb(Zn$_{1/3}$Nb$_{2/3}$)O$_3$—PbTiO$_3$) of lead zincate niobate and lead titanate, and the like may be used.

The piezoelectric material of the piezoelectric material layer 74 is not limited to the above piezoelectric materials and any material can be used as long as the material is formed with a crystal having a perovskite structure.

Since the piezoelectric material layer 74 of the embodiment is formed on the buffer layer 72 which functions as an orientation control layer, the crystal of the piezoelectric material layer 74 is a film strongly oriented in a specific orientation, particularly, to the (100) plane. Accordingly, the growth of the crystal having a perovskite structure in the piezoelectric material layer 74 is promoted and crack occurrence of the piezoelectric material layer 74 is suppressed as shown in Examples which will be described later. The film in which the crystal is strongly oriented in a specific orientation can exhibit piezoelectric properties better in comparison with the film in which the crystal is not strongly oriented. As s result, the piezoelectric properties of the piezoelectric material layer 74 of the embodiment become excellent.

The thickness of the buffer layer 72 and the piezoelectric material layer 74 is not limited. For example, the thickness of the buffer layer 72 is 10 nm to 200 nm. In addition, the thickness of the piezoelectric material layer 74 is, for example, equal to or less than 3 μm, and preferably 0.3 to 1.5 μm.

A lead electrode 90 which made of, for example, gold (Au), and which is drawn from the vicinity of the end portion of the ink supply path 14 side and extends on the elastic film 50 and on the insulating film provided as necessary, is connected to each second electrode 80 which is the individual electrode of the piezoelectric element 300.

A protective substrate 30 having the manifold portion 31 which configures at least a part of a manifold 100 is bonded on the flow passage forming substrate 10 on which the piezoelectric element 300 is formed, that is, on the first electrode 60, the elastic film 50, the insulating film provided as necessary, and the lead electrode 90 using an adhesive 35. In the embodiment, the manifold portion 31 penetrates the protective substrate 30 in the thickness direction, is formed along the width direction of the pressure generating chambers 12, and communicates with the communication portion 13 of the flow passage forming substrate 10 as described above, so as to configure the manifold 100 that is the common ink chamber of each of the pressure generating chambers 12. Moreover, only the manifold portion 31 may be used as the manifold by dividing the communication portion 13 of the flow passage forming substrate 10 into plural portions for each of the pressure generating chambers 12. Furthermore, for example, the ink supply path 14 communicating the manifold 100 and each of the pressure generating chambers 12 to a member interposed between the flow passage forming substrate 10 and the protective substrate 30 (for example, the elastic film 50, the insulating film provided as necessary, or the like) may be provided by providing only the pressure generating chambers 12 in the flow passage forming substrate 10.

In addition, a piezoelectric element supporting portion 32 having a space which does not hinder the movement of the piezoelectric element 300 is provided in a region in the protective substrate 30 which faces the piezoelectric element 300. The piezoelectric element supporting portion 32 is necessary to have a space which does not hinder the movement of the piezoelectric element 300, and the space may be sealed or may not be sealed.

It is preferable to use materials having substantially the same thermal expansion coefficient as that of the flow passage forming substrate 10, for example, glass, ceramics, and like, as the protective substrate 30, and the protective substrate was formed using a silicon single crystal substrate made of the same material as that of the flow passage forming substrate 10 in the embodiment.

In addition, a through hole 33 that penetrates the protective substrate 30 in the thickness direction is provided in the protective substrate 30. In addition, the through hole is provided such that the vicinity of the end portion of the lead electrode 90 which is drawn from each of the piezoelectric elements 300 is exposed to the inside of the through hole 33.

Furthermore, a driving circuit 120 is fixed to the protective substrate 30 to drive the piezoelectric elements 300 provided in parallel. It is possible to use, for example, a circuit substrate, a semiconductor integrated circuit (IC) and the like as the driving circuit 120. In addition, the driving circuit 120 and the lead electrode 90 are electrically connected through a connecting wire 121 made of a conductive wire such as a bonding wire.

A compliance substrate 40 formed with a sealing film 41 and a fixing plate 42 is bonded on the protective substrate 30.

Here, the sealing film 41 is made of a material having low rigidity and flexibility, and one surface of the manifold portion 31 is sealed by the sealing film 41. In addition, the fixing plate 42 is made of a relatively hard material. Since the region of the fixing plate 42 facing the manifold 100 forms an opening portion 43 that is fully removed in the thickness direction, the one surface of the manifold 100 is sealed only by the sealing film 41 having flexibility.

In the ink jet type recording head I of the embodiment, an ink is imported from an ink introducing port which is connected to external ink supplying means (not shown), the inside from the manifold 100 to the nozzle openings 21 is filled with the ink, and thereafter, a voltage is applied between the first electrode 60 and the second electrode 80 corresponding to the pressure generating chamber 12 according to a recording signal from the driving circuit 120 so as to cause the elastic film 50, the adhesion layer 56, the first electrode 60 and the piezoelectric layer 70 to be subjected flexural deformation, such that the pressure in each pressure generating chamber 12 is increased thereby, discharging ink droplets from the nozzle openings 21.

Next, an example of the method of manufacturing the ink jet type recording head of the embodiment will be described with reference to FIGS. 4 to 8. Furthermore, FIGS. 4 to 8 are cross-sectional views of the pressure generating chamber in the longitudinal direction. In the embodiment, the case where the piezoelectric material layer 74 is made of a composite oxide containing Bi, Fe, Ba and Ti is described as an example.

Firstly, as shown in FIG. 4(a), a silicon dioxide film made of silicon dioxide ($SiO_2$) or the like forming the elastic film 50 is formed on the surface of a flow passage forming substrate wafer 110 which is a silicon wafer, by thermal oxidation or the like. Next, as shown in FIG. 4(b), the adhesion layer 56 made of titanium oxide or the like is formed on the elastic film 50 (silicon dioxide film) by the sputtering method, thermal oxidation, or the like.

As shown in FIG. 5(a), the first electrode 60 made of platinum is formed throughout the entire surface of the adhesion layer 56 by a sputtering method or a vapor deposition method. As shown in FIG. 5(b), a resist (not shown) having a predetermined shape is formed on the first electrode 60 as a mask and the side surfaces of the adhesion layer 56 and the first electrode 60 are patterned at the same time to be inclined.

Next, after the resist is peeled off, a piezoelectric layer precursor film 71 containing manganese and bismuth, or manganese, bismuth and iron is formed on the first electrode 60. For example, the piezoelectric layer precursor film 71 can be manufactured by chemical solution methods such as an MOD (Metal-Organic Decomposition) method in which a solution containing a metallic complex is applied, dried and further baked at a high temperature to obtain the buffer layer 72 made of a metallic oxide, and a sol-gel method. Additionally, the buffer layer 72 can be manufactured by a laser ablation method, a sputtering method, a pulse laser deposition method (PLD method), a CVD method, and an aerosol deposition method.

As a specific example of the procedure when the buffer layer 72 is formed by the chemical solution method, first, as shown in FIG. 5(c), the buffer layer precursor film 71 is formed on the first electrode 60 made of Pt, by applying an MOD solution containing a metallic complex, specifically, a metallic complex containing Bi, Mn, and Fe as necessary or a buffer layer forming composition (buffer layer precursor solution) made of a sol by a spin coat method (buffer layer precursor solution application process).

The buffer layer precursor solution to be applied is obtained by mixing the metallic complexes capable of forming the composite oxide of bismuth manganate or a mixed crystal of bismuth manganate and bismuth ferrite by baking and dissolving or dispersing the mixture in an organic solvent. For example, as the metallic complexes respectively containing Bi or Fe, Co, Na, Mg and the like alkoxides, organic acid salts, and β-diketone complexes can be used. Examples of the metallic complexes containing Bi include bismuth 2-ethylhexanoate, and bismuth acetate. Examples of the metallic complexes containing Mn include manganese 2-ethylhexanoate and manganese acetate. Examples of the metallic complexes containing Fe include iron 2-ethylhexanoate, iron acetate and tris(acetylacetonato)iron. Of course, a metal complex containing two or more of Bi, Mn and Fe may also be used. In addition, examples of solvents for the buffer layer precursor solution include propanol, butanol, pentanol, hexanol, octanol, ethylene glycol, propylene glycol, octane, decane, cyclohexane, xylene, toluene, tetrahydrofuran, acetic acid and octylic acid.

In this manner, to produce the buffer layer 72, for example, a precursor solution including a metallic complex containing Bi, Mn and Fe may be applied on the first electrode 60 made of Pt to carry out baking. The composition of the material of the precursor solution is not particularly limited, and each metal may be mixed so as to cause metals to have desired molar ratios.

Next, the buffer layer precursor film 71 is heated to a predetermined temperature (for example, 150 to 200° C.) and dried for a predetermined time (buffer layer drying process). Next, the dried buffer layer precursor film 71 is heated to a predetermined temperature (for example, 350 to 450° C.) and retained for a predetermined time, thereby carrying out degreasing (buffer layer degreasing process). Herein, the degreasing refers to separating the organic components included in the buffer layer precursor film 71 in the form of, for example, $NO_2$, $CO_2$, $H_2O$, and the like. The atmosphere of the buffer layer drying process and the buffer layer degreasing process is not limited, and the air, an oxygen atmosphere, or an inert gas may also be used.

Figure 5:
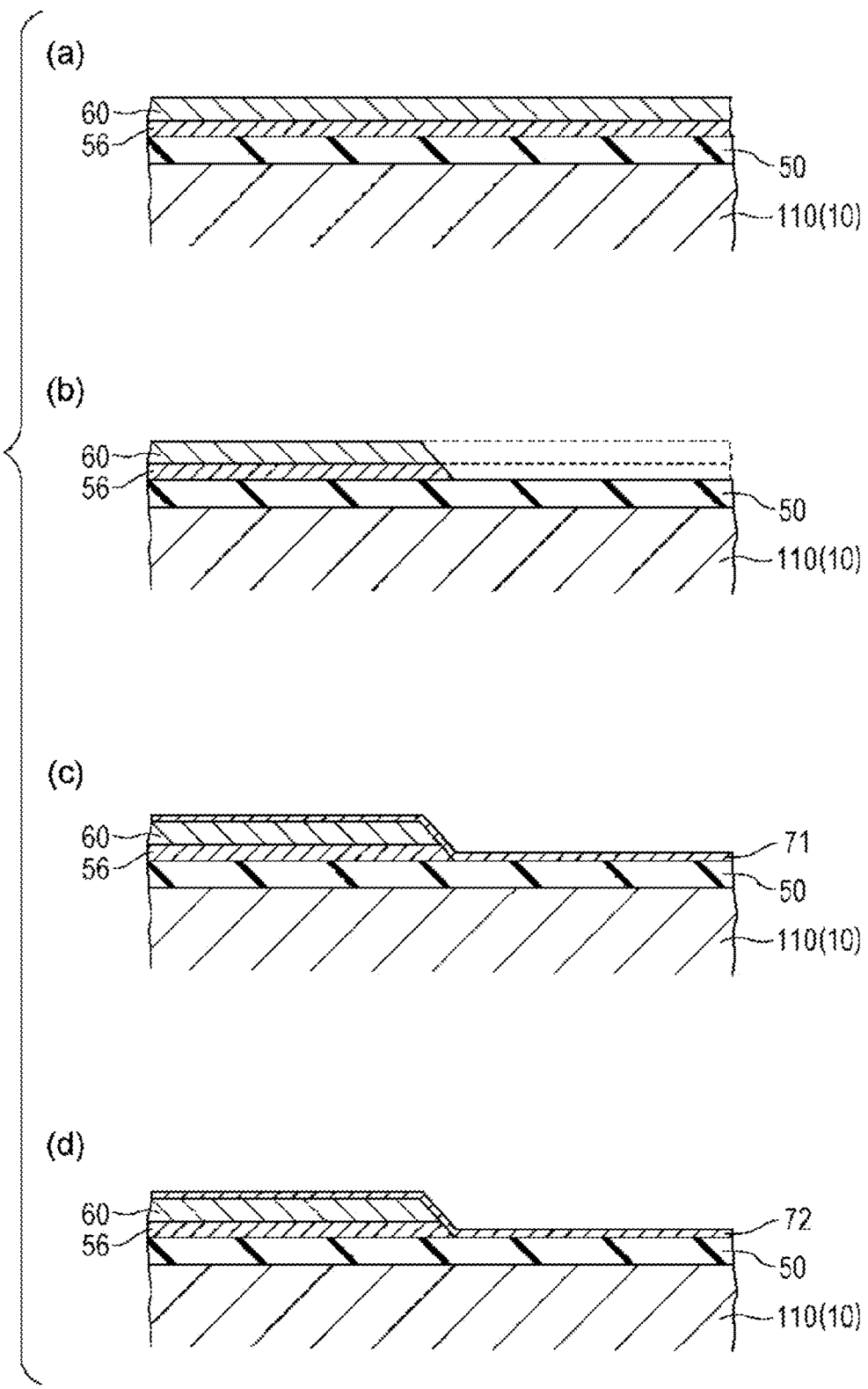
FIG. 5 is a cross-sectional view showing a process of manufacturing the recording head according to Embodiment 1.

Next, as shown in FIG. 5(*d*), the buffer layer precursor film 71 is heated to a predetermined temperature, for example, about 600 to 850° C. and retained for a predetermined time, for example, for 1 minute to 10 minutes, thereby crystallizing the buffer layer precursor film and forming the buffer layer 72 made of an oxide of manganese and bismuth or an oxide of manganese, bismuth and iron (baking process).

In the buffer layer baking process, the atmosphere is not limited, and the air, an oxygen atmosphere, or an inert gas may also be used. As a heating apparatus used in the buffer layer drying process, the buffer layer degreasing process and the buffer layer baking process, for example, there are an RTA (Rapid Thermal Annealing) apparatus which performs heating by irradiation of an infrared lamp, and a hot plate.

While in this embodiment, the buffer layer 72 made of a single layer by carrying out the application process once is formed, the above-described application process, the drying process, and the degreasing process, or the application process, the drying process, the degreasing process, and the baking process may be repeated plural times according to a desired thickness to formed the buffer layer 72 having plural layers.

The piezoelectric material layer 74 made of a composite oxide containing Bi, Fe, Ba and Ti is formed on the buffer layer 72. The piezoelectric material layer 74 can be manufactured such that a solution containing a metallic complex is applied, dried and degreased. In addition, the piezoelectric material layer 74 can be manufactured by a laser ablation method, a sputtering method, a pulse laser deposition method (PLD method), a CVD method, an aerosol deposition method, or the like.

Figure 6:
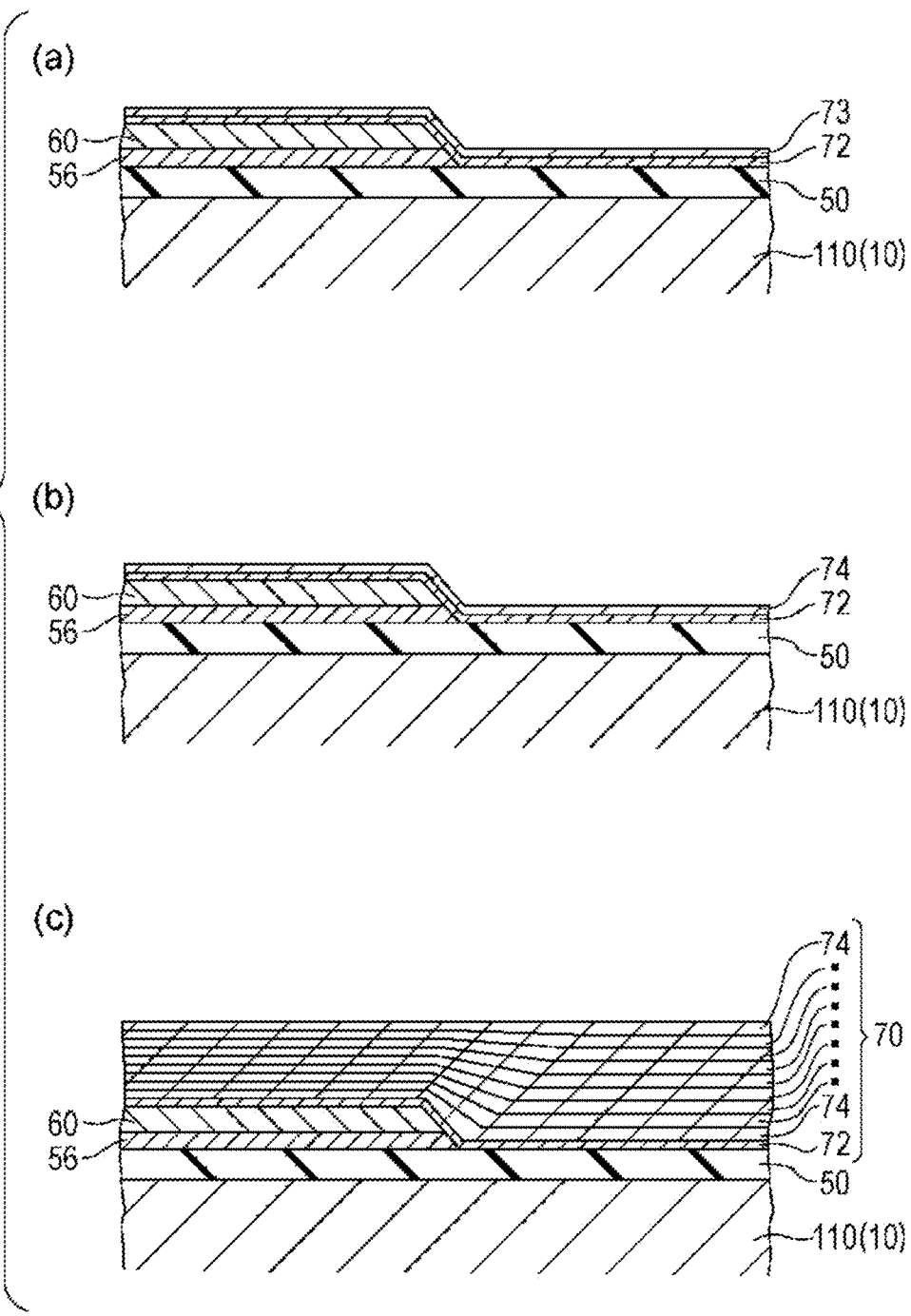
FIG. 6 is a cross-sectional view showing a process of manufacturing the recording head according to Embodiment 1.
Figure 7:
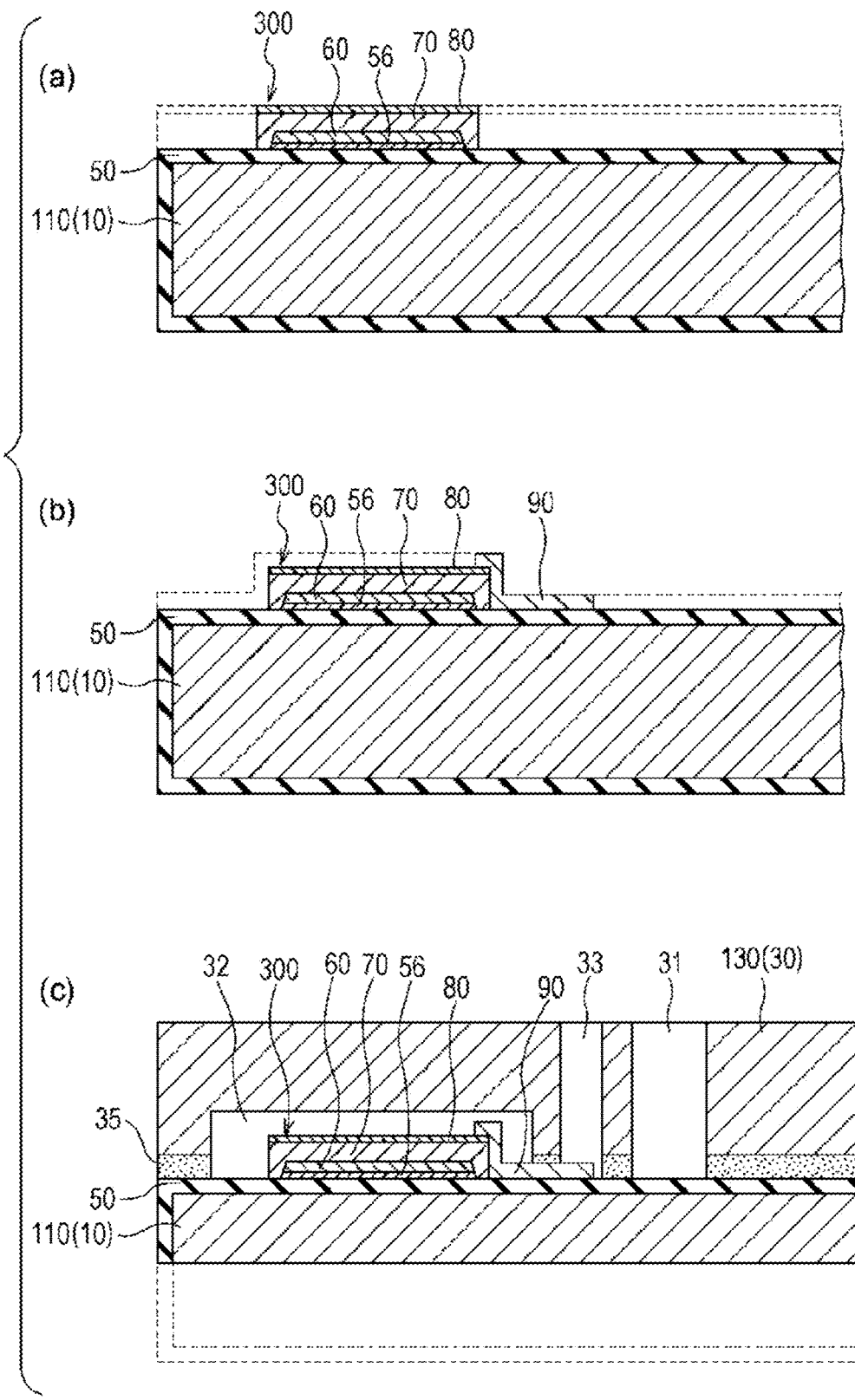
FIG. 7 is a cross-sectional view showing a process of manufacturing the recording head according to Embodiment 1.
Figure 8:
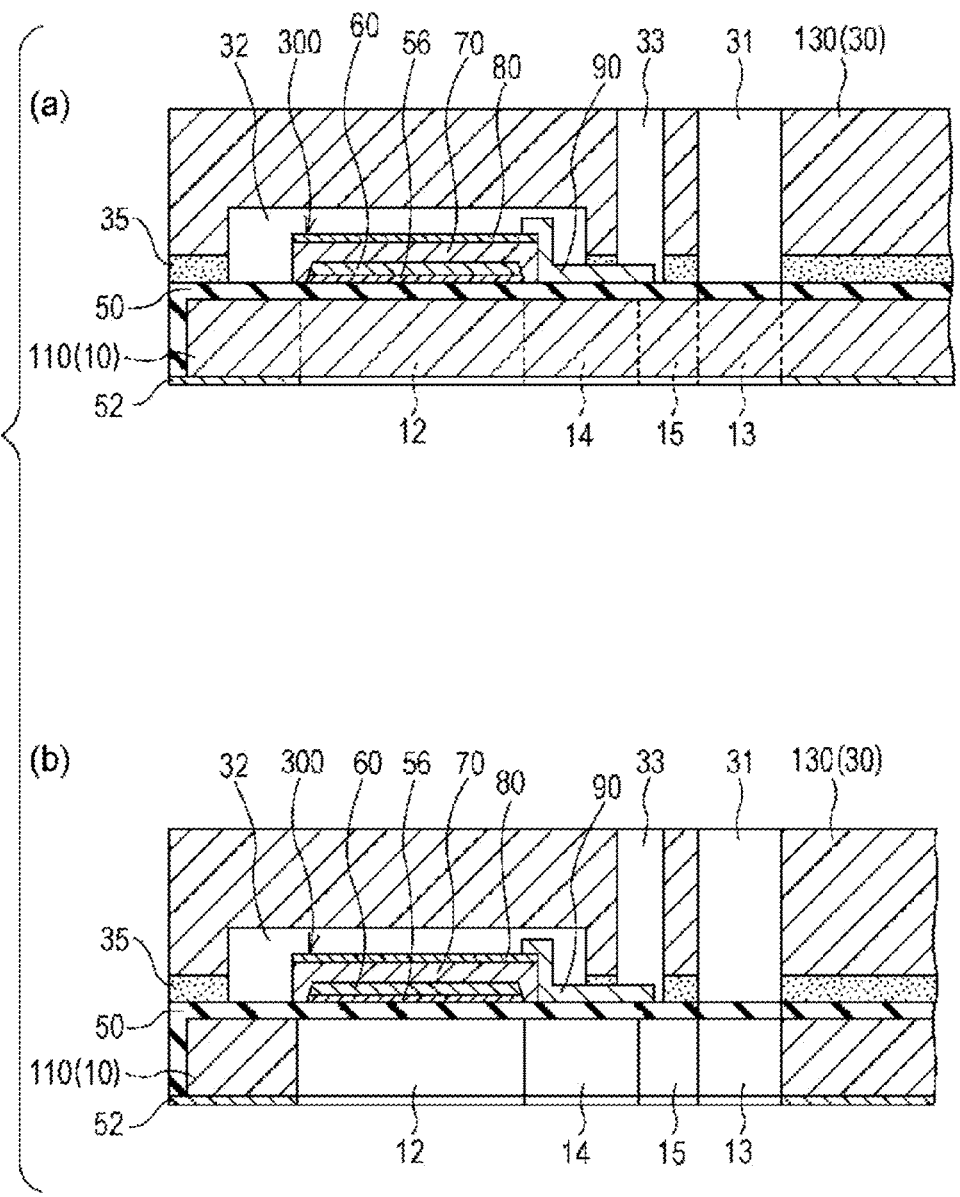
FIG. 8 is a cross-sectional view showing a process of manufacturing the recording head according to Embodiment 1.

As a specific example of the procedure when the piezoelectric material layer 74 is formed by the chemical solution method, first, as shown in FIG. 6(*a*), a piezoelectric material layer 74 precursor film 73 (piezoelectric layer precursor film) is formed on the buffer layer 72 by applying an MOD solution containing a metallic complex, specifically, a metallic complex containing Bi, Fe, Ba and Ti or a buffer layer forming composition (buffer layer precursor solution) made of a sol by a spin coat method (application process).

The precursor solution to be applied is obtained by mixing the metallic complexes capable of forming the composite oxide that contains Bi, Fe, Ba and Ti by baking and dissolving or dispersing the mixture in an organic solvent. When the piezoelectric material layer 74 made of the composite oxide containing Mn, Co and Cr is formed, a precursor solution including a metallic complex containing Mn, Co and Cr is further used. The metallic complexes respectively containing Bi or Fe, Ba, Ti, Mn, Co and Cr may be mixed so as to cause metals to have desired molar ratios. For example, as the metallic complexes respectively containing Bi, Fe, Ba, Ti, Mn, Co and Cr, alkoxides, organic acid salts, and β-diketone complexes can be used. Examples of the metallic complexes containing Bi include bismuth 2-ethylhexanoate, and bismuth acetate. Examples of the metallic complexes containing Fe include iron 2-ethylhexanoate, iron acetate and tris(acetylacetonate) iron. Examples of the metallic complexes containing Ba include barium isopropoxide, barium 2-ethylhexanoate, and barium acetylacetonate. Examples of the metallic complexes containing Ti include titanium isopropoxide, titanium 2-ethylhexanoate, and titanium(di-i-propoxide)bis(acetylacetonate). Examples of the metallic complexes containing Mn include manganese 2-ethylhexanoate and manganese acetate. Examples of the organic metallic compounds containing Co include cobalt 2-ethylhexanoate and cobalt (III) acetylacetonate. An example of the organic metallic compound including Cr includes chrome 2-ethylhexanoate. Of course, a metallic complex containing two or more from Bi or Fe, Ba, Ti, Mn, Co and Cr may be used. In addition, examples of the solvents for the precursor solution include propanol, butanol, pentanol, hexanol, octanol, ethylene glycol, propylene glycol, octane, decane, cyclohexane, xylene, toluene, tetrahydrofuran, acetic acid and octylic acid.

Next, the piezoelectric material layer precursor film 73 is heated to a predetermined temperature (for example, 150 to 200° C.) and dried for a predetermined time (drying process). Next, the dried piezoelectric material layer precursor film 73 is heated to a predetermined temperature (for example, 350 to 450° C.) and retained for a predetermined time, thereby carrying out degreasing (degreasing process). Herein, the degreasing refers to separating the organic components included in the piezoelectric material layer precursor film 73 in the form of, for example, $NO_2$, $CO_2$, $H_2O$, and the like. The atmosphere of the drying process and the degreasing process is not limited, and the air, an oxygen atmosphere, or an inert gas may also be used. The application process, the drying process and the degreasing process can be carried out plural times.

Next, as shown in FIG. 6(*b*), the piezoelectric material layer precursor film 73 is heated to a predetermined temperature, for example, about 600 to 850° C. and retained for a predetermined time, for example, for 1 minute to 10 minutes (baking process). The piezoelectric material layer precursor film is crystallized to form the piezoelectric material layer 74 made of an oxide having a perovskite structure containing Bi, Fe, Ba and Ti. In the baking process, the atmosphere is not limited, and the air, an oxygen atmosphere, or an inert gas may also be used. As a heating apparatus used in the drying process, the degreasing process and the baking process, for example, there are an RTA (Rapid Thermal Annealing) apparatus which performs heating by irradiation of an infrared lamp, and a hot plate.

Subsequently, by repeating the above-described application process, the drying process, and the degreasing process, or the application process, the drying process, the degreasing process, and the baking process plural times according to a desired thickness, and forming plural piezoelectric material layers 74, the piezoelectric layer 70 having a predetermined thickness and formed with the buffer layer 72 and the plural piezoelectric material layers 74 is formed, as shown in FIG. 6(c). For example, when a thickness per solution application is about 0.1 μm, the total thickness of the piezoelectric layer 70 formed with a single buffer layer 72 and ten piezoelectric material layers 74 is about 1.1 μm. In the embodiment, the piezoelectric material layers 74 are laminated, but a single piezoelectric material layer may be used.

In this manner, when the buffer layer 72 made of bismuth manganate or a mixed crystal of bismuth manganate and bismuth ferrite is formed, crack occurrence can be more remarkably suppressed in comparison with the case where the layer (piezoelectric material layer 74 in the embodiment) made of a piezoelectric material containing Bi, Fe, Ba and Ti is not formed on the buffer layer. It is assumed that this is because the growth of the crystal having a perovskite structure in the piezoelectric material layer 74 is promoted by the buffer layer 72 and the crystal is strongly oriented in a specific orientation, particularly, to the (100) plane. The film in which the crystal is strongly oriented in a specific orientation has a favorable crystallinity and can exhibit piezoelectric properties better in comparison with the case of random orientation.

The orientation properties of the piezoelectric material layer 74 formed on the buffer layer 72 is controlled by the buffer layer 72 to form the piezoelectric material layer 74 strongly oriented in a specific orientation depending on the composition and film forming conditions of the buffer layer 72. In the embodiment, the film in which the crystal of the piezoelectric material layer 74 is strongly oriented in a specific orientation, particularly, to the (100) plane is obtained by forming the buffer layer 72 using bismuth manganate or the mixed crystal of bismuth manganate and bismuth ferrite.

After the piezoelectric layer 70 is formed, the second electrode 80 made of platinum or the like is formed on the piezoelectric layer 70 by the sputtering method or the like as shown in FIG. 7(a), and the piezoelectric layer 70 and the second electrode 80 are patterned at the same time in the region facing each of the pressure generating chambers 12, thereby forming the piezoelectric element 300 having the first electrode 60, the piezoelectric layer 70, and the second electrode 80. Meanwhile, the patterning of the piezoelectric layer 70 and the second electrode 80 can be collectively carried out by dry etching through a resist formed into a predetermined shape (not shown). After that, annealing may be carried out in a temperature range of, for example, 600 to 850° C. as necessary. Accordingly, favorable interfaces between the piezoelectric layer 70, the first electrode 60 and the second electrode 80 can be formed and the crystallinity of the piezoelectric layer 70 can be further increased.

Next, as shown in FIG. 7(b), after the lead electrode 90 made of, for example, gold (Au) or the like is formed throughout the entire surface of the flow passage forming substrate wafer 110, patterning is carried out for each piezoelectric element 300 through, for example, a mask pattern (not shown) formed of a resist and the like.

Next, as shown in FIG. 7(c), after a protective substrate wafer 130 formed of the plural protective substrates 30 which are silicon wafers is bonded to the side of the piezoelectric element 300 of the flow passage forming substrate wafer 110 with the adhesive 35, the flow passage forming substrate wafer 110 is made thin to have a predetermined thickness.

Next, as shown in FIG. 8(a), a mask film 52 is newly formed on the flow passage forming substrate wafer 110 and is patterned into a predetermined shape.

Then, as shown in FIG. 8(b), the pressure generating chamber 12, the communication portion 13, the ink supply path 14, the communication path 15 and the like corresponding to the piezoelectric elements 300 are formed by carrying out anisotropic etching (wet etching) on the flow passage forming substrate wafer 110 through the mask film 52 using an alkali solution such as KOH.

Then, unnecessary portions in the outer circumferential portions of the flow passage forming substrate wafer 110 and the protective substrate wafer 130 are cut, for example, by dicing. Moreover, after the mask film 52 on the surface of the flow passage forming substrate wafer 110 on the opposite side of the protective substrate wafer 130 is removed, the nozzle plate 20 which has the punctured nozzle opening 21 is bonded to a side opposite to the protective substrate wafer and the compliance substrate 40 is bonded to the protective substrate wafer 130, and the flow passage forming substrate wafer 110 and the like are divided into the flow passage forming substrate 10 and the like with one chip size to obtain the ink jet type recording head I of the embodiment as shown in FIG. 1.

EXAMPLES

Hereinafter, examples will be shown and the invention will be described more specifically. In addition, the invention is not limited to the following examples. The composition and baking conditions of the buffer layer and the concentration of the buffer layer precursor solution in Examples 1 to 7 and Comparative Examples 1 and 2 are shown in Table 1.

Example 1

First, a silicon dioxide ($SiO_2$) film having a thickness of 1200 nm was formed on the surface of a (100)-oriented single crystal silicon (Si) substrate by thermal oxidation. Next, a titanium film having a thickness of 40 nm was formed on the $SiO_2$ film by the RF magnetron sputtering method, and thermally oxidized to form a titanium oxide film. Next, a (111)-oriented platinum film (first electrode 60) having a thickness of 100 nm was formed on the titanium oxide film by the RF magnetron sputtering method.

Next, the buffer layer 72 containing Bi, Mn and Fe was formed on the first electrode 60. The method is as follows. First, the n-octane solutions of bismuth 2-ethylhexanoate, iron 2-ethylhexanoate, and manganese 2-ethylhexanoate were mixed so that the molar ratio of each element is Bi:Fe:Mn=100:93:7, thereby preparing a buffer layer precursor solution.

Subsequently, the buffer layer precursor solution was dropped on the substrate on which the titanium oxide film and the platinum film were formed, and the substrate was rotated at 3000 rpm, thereby forming the buffer layer precursor film 71 by the spin coat method (buffer layer application process). Next, the substrate was dried on a hot plate at 180° C. for 2 minutes (buffer layer drying process). Subsequently, the substrate was mounted on the hot plate and degreasing was carried out at 350° C. for 2 minutes (buffer layer degreasing process). Then, the temperature was increased to 650° C. at a rate of 300° C. per second and baking was carried out at 650° C. for 2 minutes in an oxygen atmosphere by an RTA (Rapid Thermal Annealing) apparatus, thereby forming the buffer layer 72 made of a mixed crystal of bismuth manganate and bismuth ferrite (buffer layer baking process).

Next, the piezoelectric material layer 74 containing Bi, Fe, Ba, Ti and Mn was formed on the buffer layer 72. The method is as follows. First, each of the n-octane solutions of bismuth 2-ethlyhexonate, iron 2-ethylhexonate, barium 2-ethlyhexonate, titanium 2-ethlyhexonate and manganese 2-ethlyhexonate was mixed so that the molar ratio of each element is Bi:Fe:Ba:Ti:Mn=75:71.25:25:25:3.75 thereby preparing a precursor solution.

Then, the buffer layer precursor solution was dropped on the buffer layer 72 and the substrate was rotated at 3000 rpm, thereby forming the piezoelectric material layer precursor film 73 by the spin coat method (application process). Next, the substrate was dried on a hot plate at 180° C. for 2 minutes (drying process). Subsequently, degreasing was carried out at 350° C. for 2 minutes (degreasing process). Then, the temperature was increased to 750° C. at a rate of 400° C. per second and baking was carried out at 750° C. for 2 minutes in an oxygen atmosphere by an RTA (Rapid Thermal Annealing) apparatus, thereby forming the piezoelectric material layer 74 made of a composite oxide having a perovskite structure containing Bi, Fe, Ba, Ti and Mn through crystallization (baking process). Then, the application process, drying process and degreasing process of the piezoelectric material layer precursor film 73 were repeated twice, then, baking was performed, and the processes from application to baking were repeated four times so as to form the piezoelectric layer 70 having a thickness of 700 nm which is formed with the buffer layer 72 and the piezoelectric material layer 74.

Example 2

The same operations as in Example 1 were carried out except that the temperature was increased to 750° C. at a rate of 400° C. per second and baking was carried out at 750° C. for 2 minutes in an oxygen atmosphere by an RTA apparatus in baking conditions of the buffer layer precursor film.

Example 3

The same operations as in Example 1 were carried out except that using a mixture in which n-octane solutions of bismuth 2-ethlyhexonate, iron 2-ethylhexonate and manganese 2-ethlyhexonate were mixed so that the molar concentration ratio of each element is Bi:Fe:Mn=100:99.3:0.7 as a buffer layer precursor solution, the temperature was increased to 750° C. at a rate of 400° C. per second and baking was carried out at 750° C. for 2 minutes in an oxygen atmosphere by an RTA apparatus in baking conditions of the buffer layer precursor film.

Example 4

The same operations as in Example 1 were carried out except that using a mixture in which n-octane solutions of bismuth 2-ethlyhexonate, iron 2-ethylhexonate and manganese 2-ethlyhexonate were mixed so that the molar concentration ratio of each element is Bi:Fe:Mn=100:97:3 as a buffer layer precursor solution, the temperature was increased to 750° C. at a rate of 2° C. per second and baking was carried out at 750° C. for 2 minutes in an oxygen atmosphere by an RTA apparatus in baking conditions of the buffer layer precursor film.

Example 5

The same operations as in Example 1 were carried out except that using a mixture in which n-octane solutions of bismuth 2-ethlyhexonate, iron 2-ethylhexonate and manganese 2-ethlyhexonate were mixed so that the molar concentration ratio of each element is Bi:Fe:Mn=100:85:15 as a buffer layer precursor solution, the temperature was increased to 750° C. at a rate of 2° C. per second and baking was carried out at 750° C. for 2 minutes in an oxygen atmosphere by an RTA apparatus in baking conditions of the buffer layer precursor film.

Example 6

The same operations as in Example 1 were carried out except that using a mixture in which n-octane solutions of bismuth 2-ethlyhexonate, iron 2-ethylhexonate and manganese 2-ethlyhexonate were mixed so that the molar concentration ratio of each element is Bi:Fe:Mn=100:96:4 and the molar concentration of bismuth was adjusted to 0.125 mol/L using n-octane as a buffer layer precursor solution, the temperature was increased to 750° C. at a rate of 2° C. per second and baking was carried out at 750° C. for 2 minutes in an oxygen atmosphere by an RTA apparatus in baking conditions of the buffer layer precursor film.

Example 7

The same operations as in Example 1 were carried out except that using a mixture in which n-octane solutions of bismuth 2-ethlyhexonate, iron 2-ethylhexonate and manganese 2-ethlyhexonate were mixed so that the molar concentration ratio of each element is Bi:Fe:Mn=100:0:100 and the molar concentration of bismuth was adjusted to 0.03125 mol/L using n-octane as a buffer layer precursor solution, the temperature was increased to 700° C. at a rate of 2° C. per second and baking was carried out at 700° C. for 2 minutes in an oxygen atmosphere by an RTA apparatus in baking conditions of the buffer layer precursor film.

Example 8

The same operations as in Example 1 were carried out except that using a mixture in which n-octane solutions of bismuth 2-ethlyhexonate and manganese 2-ethlyhexonate were mixed so that the molar concentration ratio of each element is Bi:Mn=100:100 and the molar concentration of bismuth was adjusted to 0.03125 mol/L using n-octane as a buffer layer precursor solution, the temperature was increased to 700° C. at a rate of 3° C. per second and baking was carried out at 700° C. for 2 minutes in an oxygen atmosphere by an RTA apparatus in baking conditions of the buffer layer precursor film.

Next, the piezoelectric material layer 74 containing Bi, Na and Ti was formed on the buffer layer 72. The method is as follows. First, each of the n-octane solutions of bismuth 2-ethlyhexonate, sodium 2-ethylhexonate and titanium 2-ethlyhexonate was mixed so that the molar ratio of each element is Bi:Na:Ti:Mn=50:50:100 thereby preparing a precursor solution. Other operations were carried out in the same manner as in Example 1.

Example 9

Using a mixture in which n-octane solutions of bismuth 2-ethlyhexonate and manganese 2-ethlyhexonate were mixed so that the molar concentration ratio of each element is Bi:Mn=100:100 and the molar concentration of bismuth was adjusted to 0.03125 mol/L using n-octane as a buffer layer precursor solution, the temperature was increased to 700° C. at a rate of 3° C. per second and baking was carried out at 700° C. for 2 minutes in an oxygen atmosphere by an RTA apparatus in baking conditions of the buffer layer precursor film.

Subsequently, the piezoelectric material layer 74 containing lead, titanium and zirconium was formed on the buffer layer 72. The method is as follows. First, each of butyl cellosolve solvents of lead acetate trihydrate, titanium isopropoxide and zirconium acetylacetonate were mixed so that the molar ratio of each element is Pb:Ti:Zr=1.10:0.44:0.56, and diethanolamine as a stabilizer and polyethylene glycol as a thickening agent were mixed to prepare precursor solution. Other operations were carried out in the same manner as in Example 1.

Comparative Example 1

The same operations were carried out as in Example 1 except that using a precursor solution having the same composition as that of a piezoelectric material layer containing Bi, Fe, Ba, Ti and Mn, instead of using the buffer layer precursor solution, without forming the buffer layer, the temperature was increased to 750° C. at a rate of 400° C. per second and baking was carried out at 750° C. for 2 minutes in an oxygen atmosphere by an RTA apparatus in baking conditions.

Comparative Example 2

The same operations were carried out as in Example 1 except that using a precursor solution having the same composition as that of a piezoelectric material layer containing Bi, Fe, Ba, Ti and Mn, instead of using the buffer layer precursor solution, without forming the buffer layer, the temperature was increased to 750° C. at a rate of 2° C. per second and baking was carried out at 750° C. for 2 minutes in an oxygen atmosphere by an RTA apparatus in baking conditions.

Comparative Example 3

The same operations were carried out as in Example 8 except that a piezoelectric material layer was formed using a precursor solution having the same composition as that of a piezoelectric material layer containing Bi, Na and Ti, instead of using the buffer layer precursor solution, without forming the buffer layer.

Comparative Example 4

The same operations were carried out as in Example 9 except that a piezoelectric material layer was formed using a precursor solution having the same composition as that of a piezoelectric material layer containing Pb, Ti and Zr, instead of using the buffer layer precursor solution, without forming the buffer layer.

Test Example 1

Figure 9:
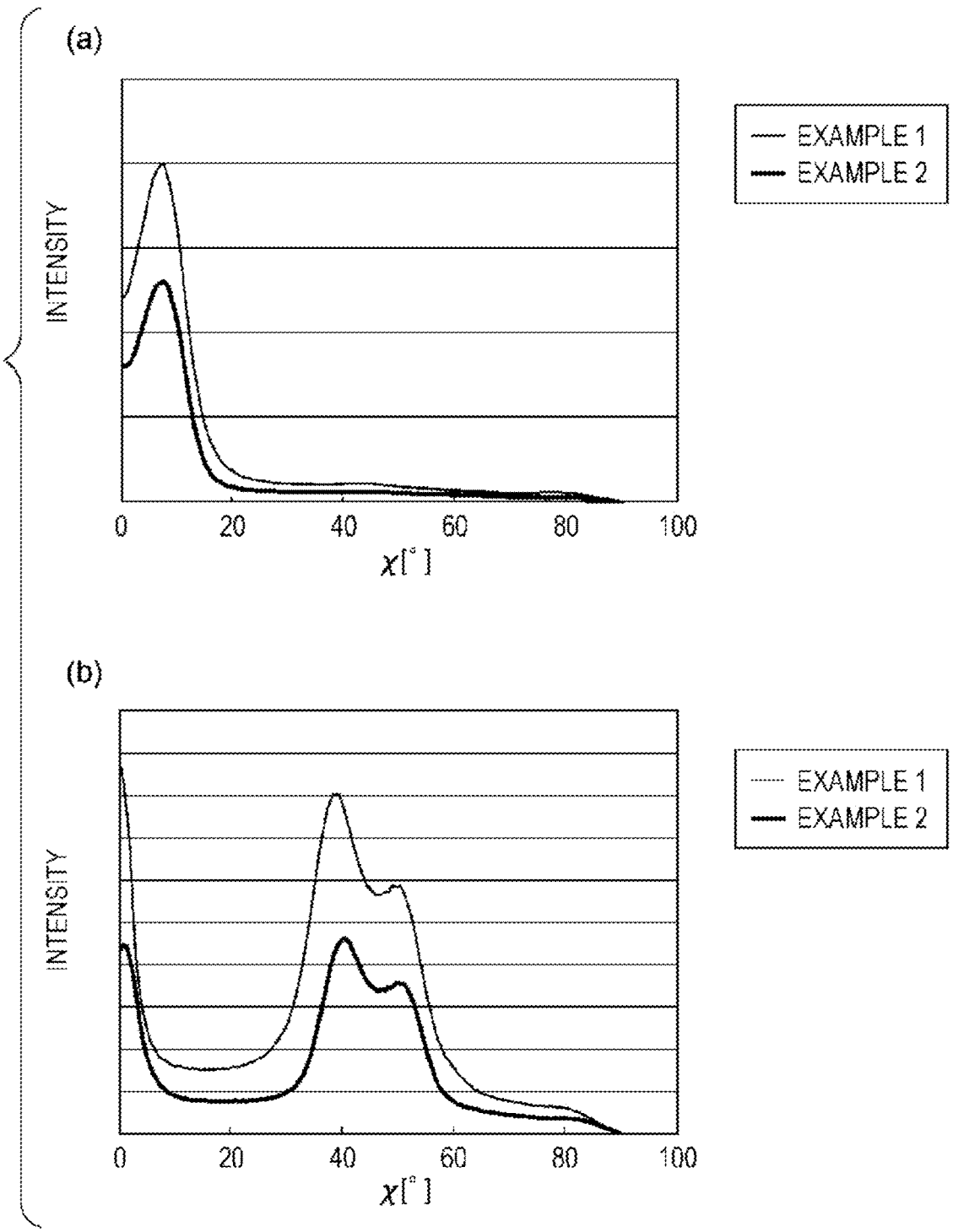
FIG. 9 is an angular dependence view in an X direction at a position of 2θ=22.5°, 32.0°.
Figure 10:
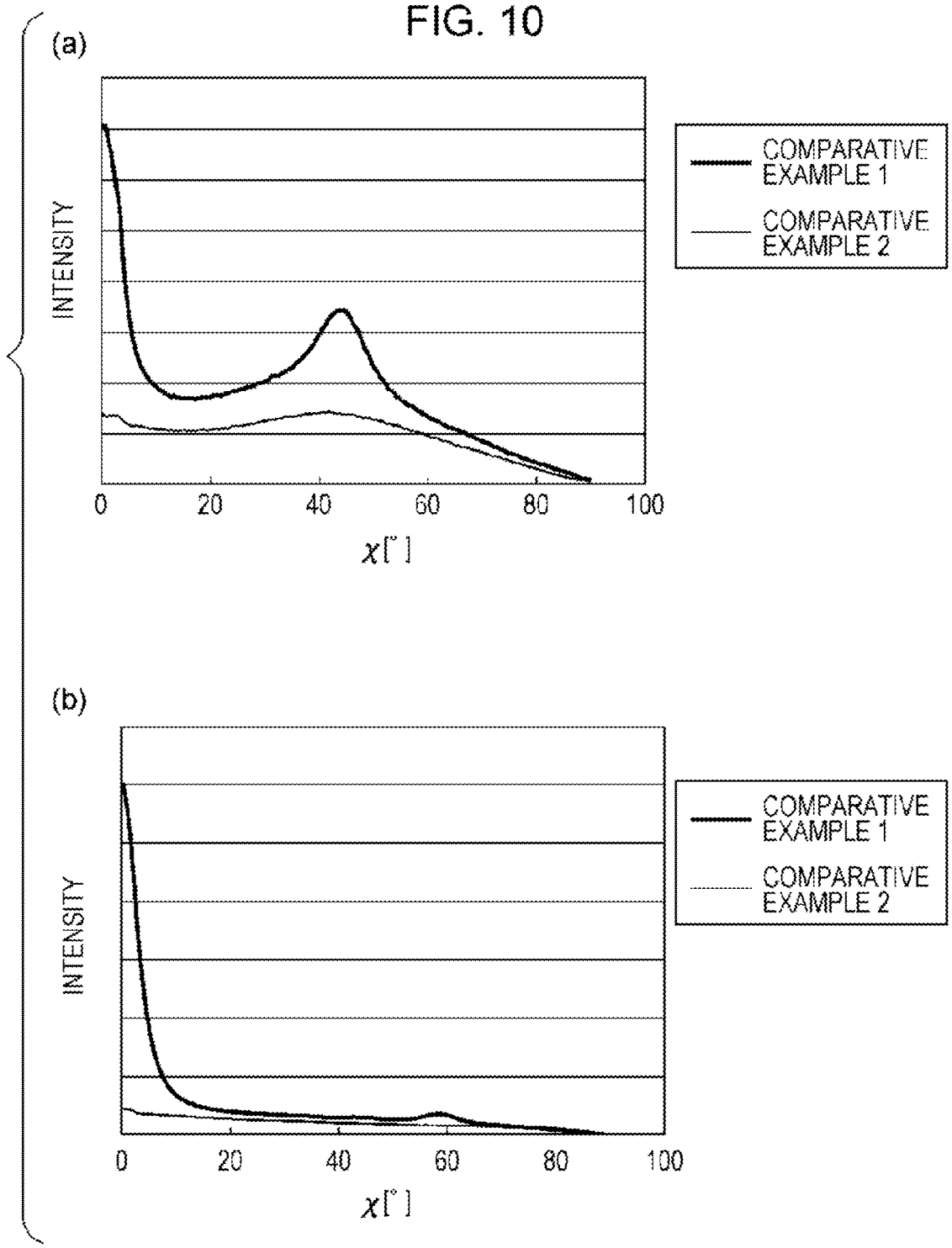
FIG. 10 is an angular dependence view in an X direction at a position of 2θ=22.5°, 32.0°.
Figure 13:
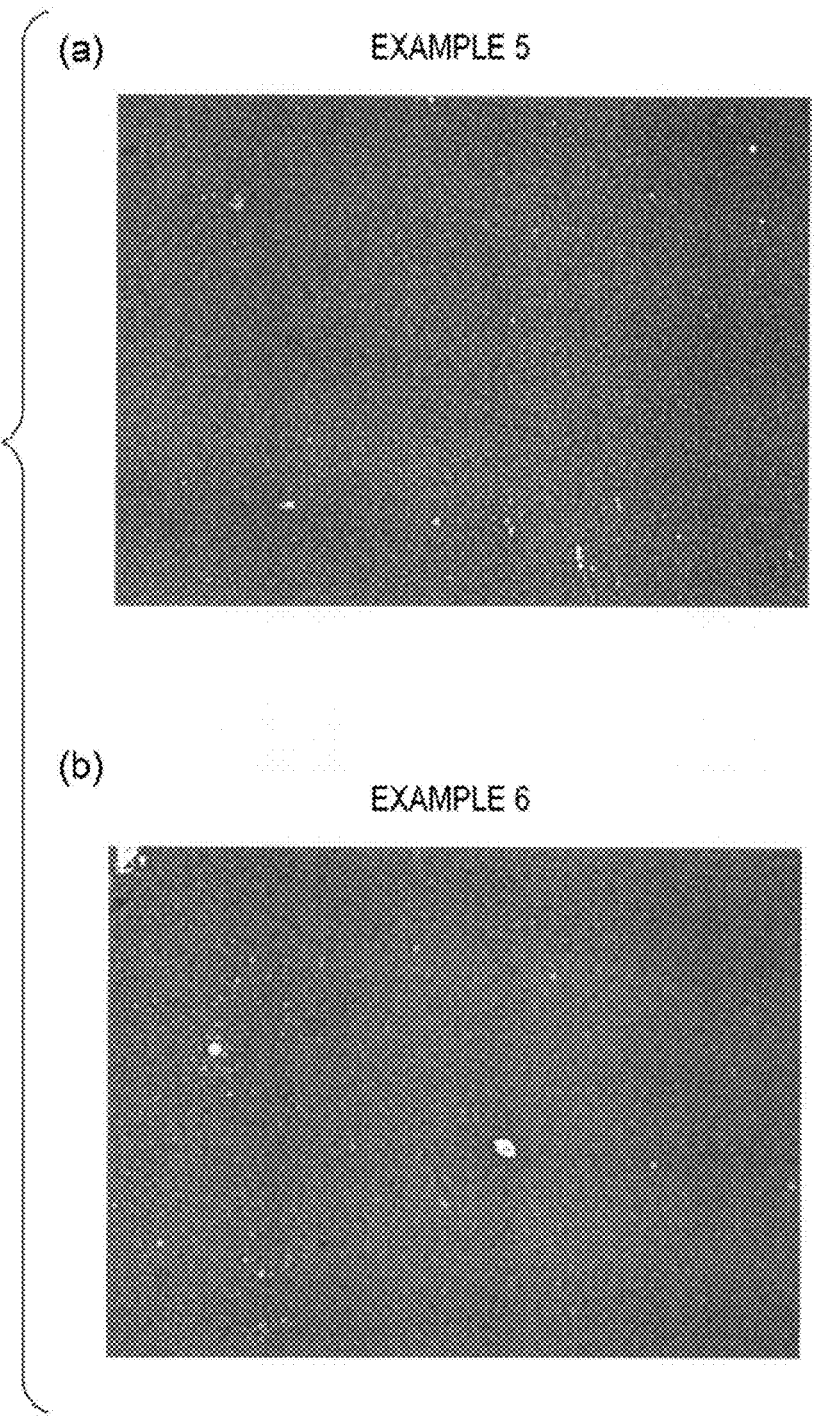
FIG. 13 is a metallurgical photomicrograph in which the surface of a piezoelectric layer in Examples 5 and 6 is observed.
Figure 14:
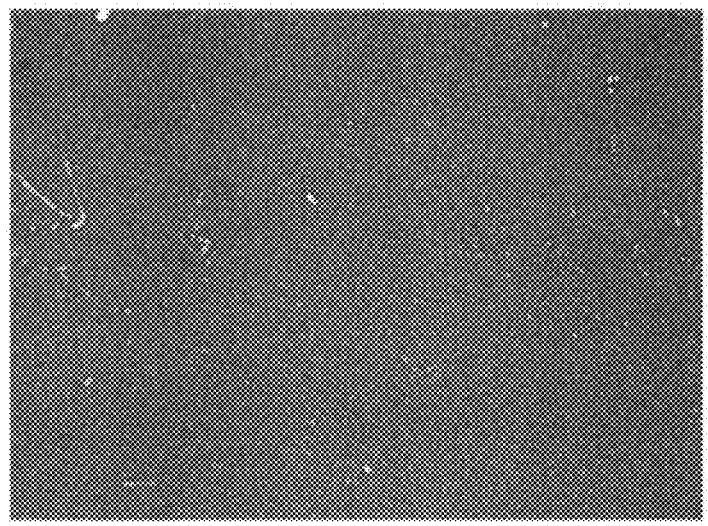
FIG. 14 is a metallurgical photomicrograph in which the surface of a piezoelectric layer of Example 7 is observed.

The piezoelectric layer (containing Bi, Fe, Ba, Ti and Mn) in Examples 1 and 2 and Comparative Examples 1 and 2 was measured in an X direction using "X'Pert PRO MRD" manufactured by PANalystical B.V. during fixation of 2θ and θ, and the results are shown in FIGS. 9 and 10.

(a) in FIGS. 9 and 10 shows the measurement results when 2θ and θ are fixed to 2θ=22.5° and θ=11.25° which is a position to obtain the diffraction peak in a case where the piezoelectric layer 70 is oriented to the (100) plane, and scanning in the X direction is carried out, and (b) shows the measurement results when 2θ and θ are fixed to 2θ=32.0° and θ=16.0° which is a position to obtain the diffraction peak in a case where the piezoelectric layer 70 is oriented to the (110) plane, and scanning in the X direction is carried out. In addition, FIG. 9 shows angular dependence in Examples 1 and 2, and FIG. 10 shows angular dependence in Comparative Examples 1 and 2.

Then, an X value in each Example and Comparative Example of (a) in FIGS. 9 and 10, which becomes the peak, was obtained and when plural peaks were obtained, the value in which X thereof is minimum was shown in Table 1. The angle of the obtained X refers to an inclined angle of the crystal orientation when the piezoelectric layer 70 is oriented to the (100) plane and the crystal orientation of the sample thereof.

Then, an X value in each Example and Comparative Example of (b) in FIGS. 9 and 10, which becomes the peak, was obtained and when plural peaks are obtained, the value in which X thereof is minimum was shown in Table 1. The angle of the obtained X refers to an inclined angle of the crystal orientation when the piezoelectric layer 70 is oriented to the (110) plane and the crystal orientation of the sample thereof.

In addition, the piezoelectric layer 70 was set as a cubical crystal and a plane index of the orientation of each Example and Comparative Example was obtained from the relationship between each crystal orientation and inclined angle obtained from the measurement to be shown in Table 1.

Furthermore, the same measurement was carried out on Examples 3 to 7 and the inclined angle to the crystal orientation and orientation were obtained to be shown in Table 1.

Consequently, it was found that by changing the composition of the buffer layer 72 and the associated preparation conditions thereof, the piezoelectric layer 70 is strongly oriented in a random direction, specifically, the piezoelectric layer 70 in Examples 3 to 7 are strongly oriented to the (100) plane and the piezoelectric layer 70 in Examples 1 and 2 can be strongly oriented to a plane almost equivalent to the (100) plane.

Test Example 2

In Examples 1 to 7 and Comparative Examples 1 and 2, the surface of the piezoelectric layer 70 in a state where the second electrode 80 is not formed was observed using a metallurgical microscope in a magnitude of 100 immediately after formation. The results are shown in FIGS. 11 to 15.

Consequently, as shown in FIGS. 11 to 14, while there was no crack occurrence in Examples 1 to 7, as shown in FIG. 15, it was found that many cracks occurred in Comparative Examples 1 and 2. In addition, as a result of observing the piezoelectric layer after 65 hours elapsed, it was confirmed that there was no crack occurrence in Examples 1 to 7 in which the buffer layer is formed. It can be considered that this is an effect obtained by promoting the growth of the crystal having a perovskite structure of the piezoelectric material layer in Examples 1 to 7 in the (100) direction to align the crystal plane in the (100) direction in which cracks do not easily occur with provision of the buffer layer.

While the microscope observation of the piezoelectric layer (containing Bi, Na and Ti) in Example 8 and the piezoelectric layer (containing Pb, Ti and Zr) in Example 9 was not carried out, it was found that the crystal orientation properties of these crystals are suppressed by providing the buffer layer, from the result of Test Example 3 which will be described later. Therefore, it is assumed that the piezoelectric layer in Examples 8 and 9 has no crack occurrence.

tive Example 4 appeared in the piezoelectric layer in Example 9 in which the buffer layer 72 is provided. As a result, it was found that the crystal of the piezoelectric layer in Example 9 is strongly oriented to the (100) plane and the (110) plane by providing the buffer layer. In addition, it was found that the (111) orientation in the piezoelectric layer in Comparative

TABLE 1

| | Buffer layer preparation condition | | | | | | Measurement Result | | |
|---|---|---|---|---|---|---|---|---|---|
| | | | | | | Bi molar | Analysis Result | | |
| | Bi composition | Fe composition | Mn composition | Baking temperature (° C.) | Temperature rising rate (° C./sec) | concentration as reference concentration (mol/l) | X (°) of (a) in FIGS. 9 and 10 | X (°) of (b) in FIGS. 9 and 10 | Orientation |
| Example 1 | 100 | 93 | 7 | 650 | 300 | 0.25000 | 7.6 | 37.4 | (1520) |
| Example 2 | 100 | 93 | 7 | 750 | 400 | 0.25000 | 7.3 | 40.1 | (1111) |
| Example 3 | 100 | 99.3 | 0.7 | 750 | 400 | 0.25000 | 0 | 45.0 | (100) |
| Example 4 | 100 | 97 | 3 | 750 | 2 | 0.25000 | 0 | 45.0 | (100) |
| Example 5 | 100 | 85 | 15 | 750 | 2 | 0.25000 | 0 | 45.0 | (100) |
| Example 6 | 100 | 96 | 4 | 750 | 2 | 0.12500 | 0 | 45.0 | (100) |
| Example 7 | 100 | 0 | 100 | 700 | 2 | 0.03125 | 0 | 45.0 | (100) |
| Comparative Example 1 | — | — | — | 750 | 400 | — | 44.8 | 0 | (110) |
| Comparative Example 2 | — | — | — | 750 | 2 | — | — | — | Non-orientation |

Test Example 3

Figure 16:
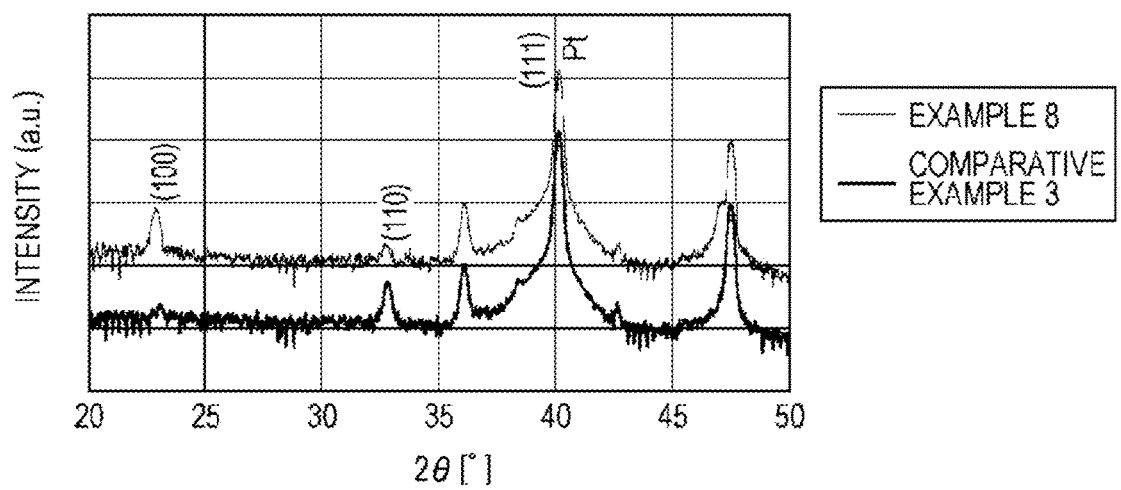
FIG. 16 is a view showing an X-ray diffraction peak of a piezoelectric layer in Example 8 and Comparative Example 3.
Figure 17:
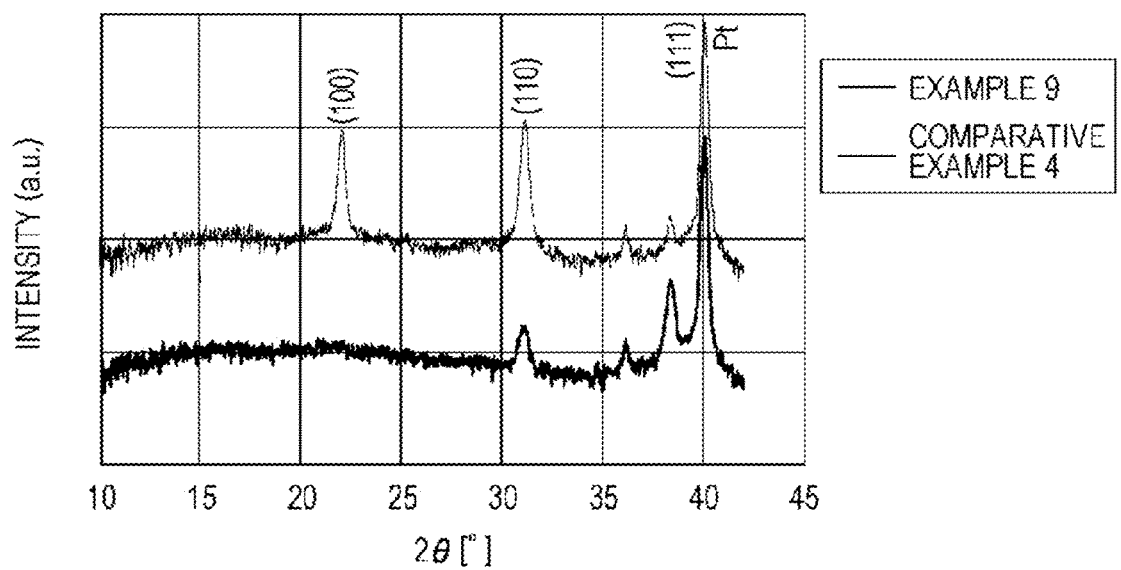
FIG. 17 is a view showing an X-ray diffraction peak of a piezoelectric layer in Example 9 and Comparative Example 4.

The X-ray diffraction of the piezoelectric layer (Bi, Na and Ti) in Example 8 and Comparative Example 3 and the piezoelectric layer (Pb, Ti and Zr) in Example 9 and Comparative Example 4 was measured using "D8 Discover" manufactured by Bruker Corporation to obtain two-dimensional mappings showing X-ray diffraction intensities and (intensity)-(2θ) graphs by integration thereof. FIGS. 16 and 17 show (intensity)-(2θ) graphs. In addition, FIG. 18 shows two-dimensional mappings of Example 8 and Comparative Example 3, and FIG. 19 shows two-dimensional mappings of Example 9 and Comparative Example 4.

At first, the measurement result of the X-ray diffraction peak will be described. As shown in FIG. 16, the peak representing the (100) plane and the peak representing the (110) plane in both the piezoelectric layer in Comparative Example 3 in which the buffer layer is not provided and the piezoelectric layer in Example 8 in which the buffer layer is provided were confirmed. As a result, it was found that the piezoelectric layers of Example 8 and Comparative Example 3 were oriented to the (100) plane and (110) plane. However, in the piezoelectric layer in Example 8, the (100) plane peak intensity is several times higher than the (110) plane peak intensity. Therefore, it was found that the piezoelectric layer in Example 8 is mainly oriented to the (100) plane. In the same manner, it was found that the piezoelectric layer in Comparative Example 3 is mainly oriented to the (110) plane. It is confirmed that the crystal orientation in Example 8 is oriented to the (100) plane in the two-dimensional mapping which will be described later. In addition, it is confirmed that the crystal orientation in Comparative Example 3 is oriented to the (110) plane in the two-dimensional mapping which will be described later (refer to FIG. 18).

As shown in FIG. 17, while a strong peak representing the (111) plane and a weak peak representing the (110) plane were only confirmed in the piezoelectric layer in Comparative Example 4 in which the buffer layer is not provided, a strong peak representing the (110) plane and a strong peak representing the (100) plane which was not confirmed in Compara- Example 4 is the main orientation. It was confirmed that the orientation in Example 9 is more mainly oriented to the (100) plane than the (110) plane (refer to FIG. 18) in the X-ray diffraction photograph which will be descried later. The detailed description will be made later.

Next, the two-dimensional mappings will be described. The two-dimensional mappings shown in FIGS. 18 and 19 are obtained by respectively fixing the position of 2θ of a two-dimensional detector to 40° and 25°, and moving the sample angle. The position in which a diffraction peak is obtained is determined such that the (100) plane is 2θ=22.9°, the (110) plane is 2θ=32.9°, and the (111) plane is around 2θ=40.6° in FIG. 18, and the (100) plane is 2θ=22.1°, the (110) plane is 2θ=31.2°, and the (111) plane is 2θ=38.5° in FIG. 19.

From the two-dimensional mappings, it can be determined whether the piezoelectric layer has a (100)-orientation, a (110)-orientation, a (111)-orientation or a random orientation. For example, when the piezoelectric layer is strongly oriented to the (100) plane, at the position (2θ) in which the diffraction line of the (100) plane is observed, a spotted diffraction line in the center portion is observed. Meanwhile, when the piezoelectric layer is randomly oriented, a ring-like diffraction line with a uniform intensity is observed.

As shown in FIG. 18, since a spotted diffraction line was observed in the center portion of the position representing the (100)-orientation, it was found that the piezoelectric layer in Example 8 is mainly oriented to the (100) plane. On the other hand, since a spotted diffraction line was observed in the center portion of the position representing the (110)-orientation, it was found that the piezoelectric layer in Comparative Example 3 is mainly oriented to the (110) plane. It is considered that the diffraction line at the position representing the (111)-orientation refers to platinum (Pt).

As shown in FIG. 19, in the piezoelectric layer in Example 9, a spotted diffraction line was observed in the center portion of the position representing the (100)-orientation, and at the position representing the (110)-orientation, the spotted diffraction line with a slightly weaker intensity than that of the diffraction line observed at the position representing the (100)-orientation and the ring-like diffraction line from the center portion to the outer circumferential portion were observed. As a result, it was found that the piezoelectric layer in Example 9 is more mainly oriented to the (100) plane than the (110) plane. Meanwhile, since a spotted diffraction line was observed in the center portion of the position representing the (111)-orientation, it was found that the piezoelectric layer in Comparative Example 4 is mainly oriented to the (111) plane. Consequently, it was confirmed that the orientation properties of the piezoelectric layer determined from the two-dimensional mappings in FIGS. 18 and 19 and the measurement results of the X-ray diffraction peaks in FIGS. 16 and 17 are matched.

From the above results of Test Examples 1 to 3, since the buffer layer is made of bismuth manganate or a mixed crystal of bismuth manganate and bismuth ferrite, it was found that the orientation of the crystallinity of the piezoelectric layer can be controlled and, particularly, the orientation degree of the (100) orientation can be improved. Then, the orientation-controlled piezoelectric layer is a film having no crack occurrence and capable of sufficiently exhibiting properties of the piezoelectric layer. The piezoelectric element, liquid ejecting head and liquid ejecting apparatus including the piezoelectric layer have excellent piezoelectric properties and high reliability.

Other Embodiments

While an embodiment of the invention has been described above, the basic configuration of the invention is not limited thereto. For example, in the above-described embodiment, a silicon single crystal substrate is exemplified as the flow passage forming substrate 10, but there is no limitation thereto, and, for example, materials, such as an SOI substrate and glass, may be used.

Furthermore, while in the above embodiment, the piezoelectric element 300 in which the first electrode 60, the piezoelectric layer 70, and the second electrode 80 are sequentially laminated on the substrate (flow passage forming substrate 10) is described as an example, there is no limitation thereto, and, for example, the invention can be also applied to a vertical vibration-type piezoelectric element in which a piezoelectric material and an electrode forming material are laminated alternately so as to extend or contract in the shaft direction.

Figure 20:
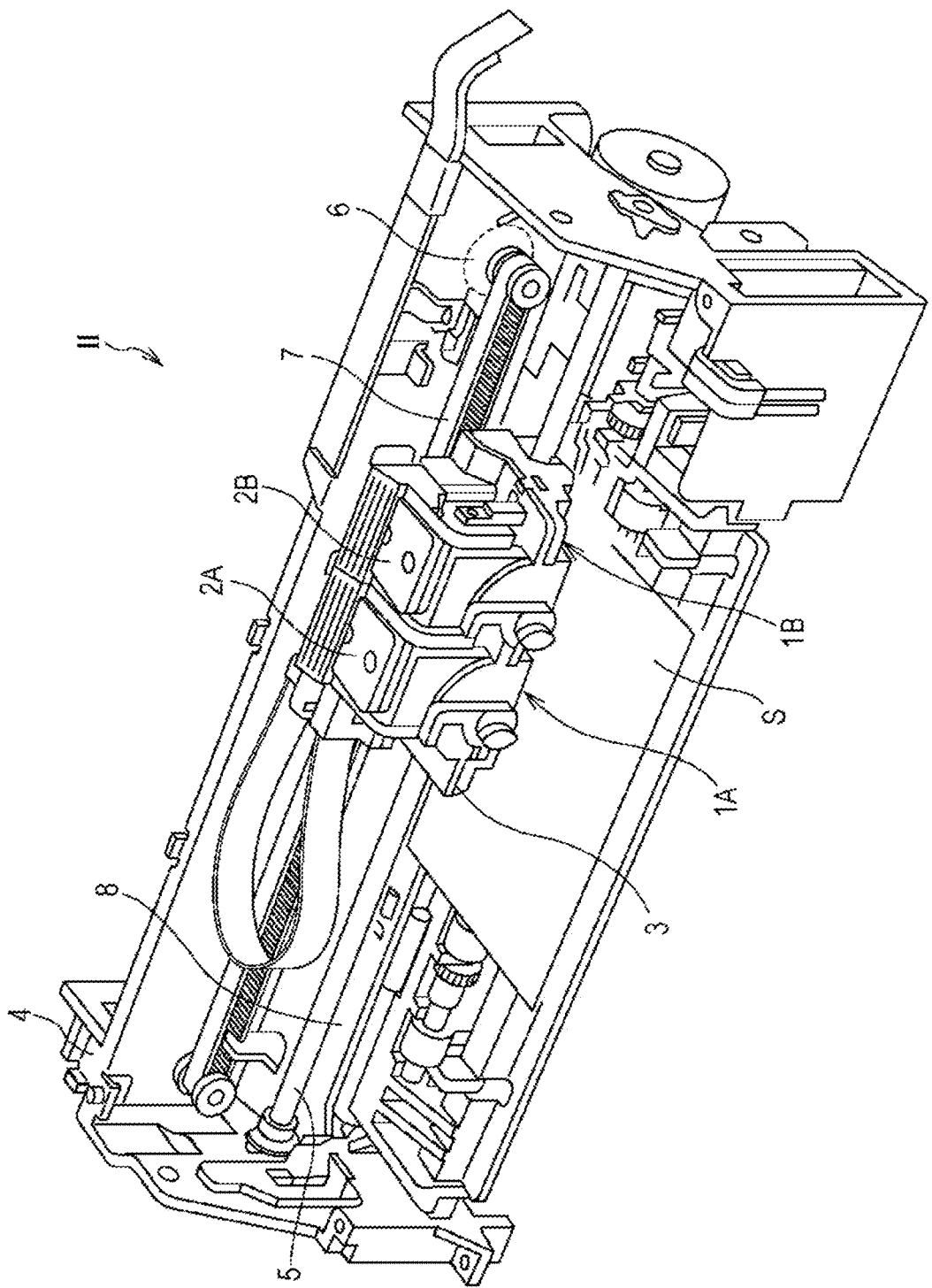
FIG. 20 is a view showing schematic configuration of a recording apparatus according to an embodiment of the invention.

In addition, the ink jet type recording head of the embodiment configures a part of a recording head unit provided with the ink flow passage communicating with an ink cartridge and the like, and is mounted on an ink jet type recording apparatus. FIG. 20 is a schematic view showing an example of the ink jet type recording apparatus.

In the ink jet type recording apparatus II shown in FIG. 20, recording head units 1A and 1B having the ink jet type recording head I are provided so that cartridges 2A and 2B configuring ink supplying means are detachably attached, and a carriage 3 having the recording head units 1A and 1B mounted thereon is provided so as to freely move along a carriage shaft 5 that is attached to an apparatus main body 4 in the shaft direction. For example, the recording head units 1A and 1B discharge a black ink composition and a color ink composition, respectively.

When the driving force of a driving motor 6 is transferred to the carriage 3 through plural gears (not shown) and a timing belt 7, the carriage 3 on which the recording head units 1A and 1B are mounted is moved along the carriage shaft 5. On the other hand, a platen 8 is provided in the apparatus main body 4 along the carriage shaft 5 and a recording sheet S which is a recording medium such as paper fed by a feed roller (not shown) is rolled on the platen 8 to be transported.

Meanwhile, in the above embodiment, the ink jet type recording head has been described as an example of the liquid ejecting head, but the invention can be applied to a wide range of liquid ejecting heads, and, naturally, can be applied even to liquid ejecting heads that eject liquid other than ink. Examples of other liquid ejecting heads include a variety of recording heads that are used in an image recording apparatus, such as a printer, color material ejecting heads used to manufacture color filters, such as liquid crystal displays, electrode material ejecting heads used to form electrodes, such as organic EL displays and FEDs (field emission displays), biological organic substance ejecting heads used to manufacture bio chips, and the like.

In addition, the piezoelectric element according to the invention is not limited to the piezoelectric element used in the liquid ejecting head and can be applied to other apparatuses. As other apparatuses, for example, there may be ultrasonic apparatuses such as ultrasonic transmitters, ultrasonic motors, temperature-electric transducers, pressure-electric transducers, ferroelectric transistors, piezoelectric transformers, and filters such as filters for blocking harmful rays such as infrared rays, optical filters using a photonic crystal effect by forming quantum dots and optical filters using optical interference of a thin film. In addition, the invention can be applied to piezoelectric elements used as sensors and piezoelectric elements used as ferroelectric memories. As sensors in which piezoelectric elements are used, for example, there may be infrared sensors, ultrasound sensors, heat sensitive sensors, pressure sensors, pyroelectric sensors, gyro sensors (angular velocity sensors) and the like.

The entire disclosure of Japanese Patent Application No.: 2012-070454, filed Mar. 26, 2012 and 2013-061055, filed Mar. 22, 2013 are expressly incorporated by reference herein.

The invention claimed is:

1. A liquid ejecting head which discharges liquid from a nozzle opening, comprising:
    a piezoelectric element including:
        a first electrode;
        a piezoelectric layer formed over the first electrode; and
        a second electrode provided on the piezoelectric layer,
    wherein the piezoelectric layer;
        includes a buffer layer made of bismuth manganate or a mixed crystal of bismuth manganate and bismuth ferrite, provided on the first electrode, and
        a piezoelectric material layer having a perovskite structure, provided on the buffer layer.

2. The liquid ejecting head according to claim 1, wherein the piezoelectric material layer contains bismuth, iron, barium and titanium, bismuth, sodium and titanium, or lead, titanium and zirconium.

3. The liquid ejecting head according to claim 2, wherein the piezoelectric material layer contains bismuth, iron, barium and titanium and further contains manganese.

4. The liquid ejecting head according to claim 1, wherein the piezoelectric material layer is preferentially oriented to a (100) plane.

5. A liquid ejecting apparatus comprising the liquid ejecting head according to claim 1.

6. A piezoelectric element comprising:
    a first electrode;
    a piezoelectric layer; and
    a second electrode provided on the piezoelectric layer,
    wherein the piezoelectric layer includes:
        a buffer layer that is provided on the first electrode and that is made of bismuth manganate or a mixed crystal of bismuth manganate and bismuth ferrite, and a piezoelectric material layer having a perovskite structure, provided on the buffer layer.

7. A method of manufacturing a piezoelectric element that includes a first electrode, a piezoelectric layer and a second electrode provided on the piezoelectric layer, the method comprising:
   forming a buffer layer made of bismuth manganate or a mixed crystal of bismuth manganate and bismuth ferrite on the first electrode; and
   forming a piezoelectric material layer having a perovskite structure on the buffer layer.

* * * * *